(12) United States Patent
Meiser et al.

(10) Patent No.: US 12,471,336 B2
(45) Date of Patent: Nov. 11, 2025

(54) SEMICONDUCTOR COMPONENT HAVING A SiC SEMICONDUCTOR BODY

(71) Applicant: Infineon Technologies AG, Neubiberg (DE)

(72) Inventors: Andreas Peter Meiser, Sauerlach (DE); Caspar Leendertz, Munich (DE); Anton Mauder, Kolbermoor (DE)

(73) Assignee: Infineon Technologies AG, Neubiberg (DE)

( * ) Notice: Subject to any disclaimer, the term of this patent is extended or adjusted under 35 U.S.C. 154(b) by 89 days.

(21) Appl. No.: 18/095,260

(22) Filed: Jan. 10, 2023

(65) Prior Publication Data

US 2023/0148156 A1    May 11, 2023

Related U.S. Application Data

(60) Continuation of application No. 17/223,645, filed on Apr. 6, 2021, now Pat. No. 11,600,701, which is a
(Continued)

(30) Foreign Application Priority Data

Oct. 8, 2018    (DE) .......................... 102018124740.0

(51) Int. Cl.
*H10D 62/83*    (2025.01)
*H01L 21/02*    (2006.01)
(Continued)

(52) U.S. Cl.
CPC ... *H10D 62/8325* (2025.01); *H01L 21/02019* (2013.01); *H01L 21/0334* (2013.01);
(Continued)

(58) Field of Classification Search
CPC ............... H10D 30/668; H10D 30/658; H10D 30/0297; H10D 62/121; H10D 30/024;
(Continued)

(56) References Cited

U.S. PATENT DOCUMENTS 4,823,172 A    4/1989  Mihara
6,008,520 A    12/1999 Darwish et al.
(Continued)

FOREIGN PATENT DOCUMENTS

DE    102004029297 A1    11/2005
DE    102005041358 A1    3/2007
(Continued)

OTHER PUBLICATIONS

Hsu, Fu-Jen, et al., "High Efficiency High Reliability SiC MOSFET with Monolithically Integrated Schottky Rectifier", Proceedings of The 29th International Symposium on Power Semiconductor Devices & ICs, Sapporo, Japan, May 28-Jun. 1, 2017, pp. 45-48.
(Continued)

*Primary Examiner* — Moin M Rahman
(74) *Attorney, Agent, or Firm* — Murphy, Bilak & Homiller, PLLC

(57) ABSTRACT

A semiconductor component includes: a SiC semiconductor body; a trench extending from a first surface of the SiC semiconductor body into the SiC semiconductor body, the trench having a conductive connection structure, a structure width at a bottom of the trench, and a dielectric layer covering sidewalls of the trench; a shielding region along the bottom and having a central section which has a lateral first width; and a contact formed between the conductive connection structure and the shielding region. The conductive connection structure is electrically connected to a source electrode. In at least one doping plane extending approximately parallel to the bottom, a dopant concentration in the
(Continued)

central section deviates by not more than 10% from a maximum value of the dopant concentration in the shielding region in the doping plane. The first width is less than the structure width and is at least 30% of the structure width.

19 Claims, 16 Drawing Sheets

Related U.S. Application Data division of application No. 16/590,714, filed on Oct. 2, 2019, now Pat. No. 11,011,606.

(51) Int. Cl.

| | |
|---|---|
| *H01L 21/033* | (2006.01) |
| *H01L 21/04* | (2006.01) |
| *H01L 21/308* | (2006.01) |
| *H01L 21/31* | (2006.01) |
| *H01L 21/311* | (2006.01) |
| *H01L 21/426* | (2006.01) |
| *H10D 12/00* | (2025.01) |
| *H10D 12/01* | (2025.01) |
| *H10D 30/01* | (2025.01) |
| *H10D 30/66* | (2025.01) |
| *H10D 30/83* | (2025.01) |
| *H10D 62/10* | (2025.01) |
| *H10D 62/832* | (2025.01) |
| *H10D 64/00* | (2025.01) |
| *H10D 64/27* | (2025.01) |

(52) U.S. Cl.
CPC ........ *H01L 21/0415* (2013.01); *H01L 21/046* (2013.01); *H01L 21/3083* (2013.01); *H01L 21/31* (2013.01); *H01L 21/311* (2013.01); *H01L 21/426* (2013.01); *H10D 12/038* (2025.01); *H10D 12/481* (2025.01); *H10D 30/0297* (2025.01); *H10D 30/051* (2025.01); *H10D 30/668* (2025.01); *H10D 30/831* (2025.01); *H10D 62/105* (2025.01); *H10D 62/107* (2025.01); *H10D 64/117* (2025.01); *H10D 64/513* (2025.01)

(58) Field of Classification Search
CPC .. H10D 30/62; H10D 30/6735; H10D 30/794; H10D 30/797; H10D 62/115; H10D 62/151; H10D 62/292; H10D 62/822; H10D 64/017; H10D 64/021; H10D 64/257; H10D 64/62; H10D 30/014; H10D 30/0323; H10D 30/43; H10D 30/6744; H10D 30/6757; H10D 64/251; H10D 62/116; H10D 62/364; H10D 62/8325; H10D 12/038; H10D 12/481; H10D 30/051; H10D 30/831; H10D 62/105; H10D 62/107; H10D 64/117; H10D 64/513; H10D 12/031; H10D 12/461; H10D 64/256; H10D 64/112; H10D 62/127; H10D 62/157; H10D 30/60–798; H10D 30/021–0415; H10D 84/83–859; H10D 84/0128; H10D 84/0167; H10D 62/85–854; H10D 30/751; H10D 30/027–0278; H10D 30/63; H10D 84/016; H10D 84/0195; H10D 30/501–509; H10D 84/0193; H10D 84/853; H01L 21/02532; H01L 21/02603; H01L 21/28568; H01L 21/30604; H01L 25/105; H01L 21/30625; H01L 21/6835; H01L 21/02019; H01L 21/0334; H01L 21/0415; H01L 21/046; H01L 21/3083; H01L 21/31; H01L 21/311; H01L 21/426; H10B 63/34

See application file for complete search history.

(56) References Cited

U.S. PATENT DOCUMENTS

| | | |
|---|---|---|
| 7,582,922 B2 | 9/2009 | Werner |
| 7,700,971 B2 | 4/2010 | Ueno |
| 7,872,308 B2 | 1/2011 | Akiyama et al. |
| 7,989,882 B2 | 8/2011 | Zhang et al. |
| 8,252,645 B2 | 8/2012 | Hshieh |
| 8,431,470 B2 | 4/2013 | Lui et al. |
| 8,525,254 B2 | 9/2013 | Treu et al. |
| 8,637,922 B1 | 1/2014 | Siemieniec et al. |
| 8,653,589 B2 | 2/2014 | Hsieh |
| 9,093,522 B1 | 7/2015 | Zeng et al. |
| 9,136,372 B2 | 9/2015 | Miyahara et al. |
| 9,293,558 B2 | 3/2016 | Siemieniec et al. |
| 9,478,655 B2 | 10/2016 | Siemieniec et al. |
| 9,496,384 B2 | 11/2016 | Nakano |
| 9,577,073 B2 | 2/2017 | Esteve et al. |
| 9,837,527 B2 | 12/2017 | Siemieniec et al. |
| 9,929,265 B1 | 3/2018 | Kondo et al. |
| 10,211,306 B2 | 2/2019 | Siemieniec et al. |
| 10,304,953 B2 | 5/2019 | Aichinger et al. |
| 10,586,845 B1 | 3/2020 | Aichinger et al. |
| 10,700,192 B2 | 6/2020 | Siemieniec et al. |
| 10,714,609 B2 | 7/2020 | Aichinger et al. |
| 2003/0020134 A1 | 1/2003 | Werner et al. |
| 2006/0076617 A1 | 4/2006 | Shenoy et al. |
| 2006/0246650 A1 | 11/2006 | Williams et al. |
| 2006/0267085 A1 | 11/2006 | Matsuura |
| 2008/0121989 A1 | 5/2008 | Kocon et al. |
| 2008/0315250 A1 | 12/2008 | Onozawa |
| 2009/0146209 A1 | 6/2009 | Akiyama et al. |
| 2010/0308401 A1 | 12/2010 | Narazaki |
| 2011/0284954 A1 | 11/2011 | Hsieh |
| 2012/0248530 A1 | 10/2012 | Lui et al. |
| 2012/0319132 A1 | 12/2012 | Bhalla et al. |
| 2013/0168701 A1 | 7/2013 | Kiyosawa et al. |
| 2013/0200451 A1 | 8/2013 | Yilmaz et al. |
| 2013/0313635 A1 | 11/2013 | Nakano |
| 2013/0341711 A1 | 12/2013 | Matsumoto et al. |
| 2014/0021484 A1 | 1/2014 | Siemieniec et al. |
| 2014/0145206 A1 | 5/2014 | Siemieniec et al. |
| 2014/0145258 A1 | 5/2014 | Lin |
| 2014/0159053 A1 | 6/2014 | Chen et al. |
| 2014/0167151 A1 | 6/2014 | Yen et al. |
| 2014/0210000 A1 | 7/2014 | Tokuda et al. |
| 2014/0210001 A1 | 7/2014 | Yamazaki |
| 2016/0163852 A1 | 6/2016 | Siemieniec et al. |
| 2016/0260829 A1 | 9/2016 | Aichinger et al. |
| 2017/0236931 A1 | 8/2017 | Meiser et al. |
| 2017/0345905 A1 | 11/2017 | Siemieniec et al. |
| 2018/0122933 A1 | 5/2018 | Matocha et al. |
| 2018/0166530 A1* | 6/2018 | Lichtenwalner ..... H10D 12/481 |
| 2018/0277637 A1* | 9/2018 | Meiser .................. H10D 64/23 |
| 2018/0358449 A1 | 12/2018 | Zeng et al. |
| 2019/0067462 A1 | 2/2019 | Tamura et al. |
| 2019/0081170 A1 | 3/2019 | Kumagai |
| 2019/0109227 A1 | 4/2019 | Kobayashi et al. |
| 2019/0245075 A1 | 8/2019 | Aichinger et al. |
| 2019/0259842 A1 | 8/2019 | Basler et al. |
| 2019/0326388 A1 | 10/2019 | Arai et al. |
| 2019/0341447 A1 | 11/2019 | Siemieniec et al. |
| 2020/0161433 A1 | 5/2020 | Leendertz et al. |
| 2020/0161437 A1 | 5/2020 | Meiser et al. |

FOREIGN PATENT DOCUMENTS

| | | |
|---|---|---|
| DE | 102012211221 A1 | 1/2013 |
| DE | 102013214196 A1 | 1/2014 |
| DE | 102014113130 A1 | 3/2015 |
| DE | 102014117780 A1 | 6/2016 |
| DE | 102017108738 A1 | 10/2018 |

(56) References Cited

FOREIGN PATENT DOCUMENTS

| | | |
|---|---|---|
| DE | 102017128633 A1 | 6/2019 |
| DE | 102018103973 A1 | 8/2019 |
| DE | 102018124737 A1 | 4/2020 |
| DE | 102018124740 A1 | 4/2020 |
| JP | H06104484 A | 4/1994 |
| JP | 07240409 A | 9/1995 |
| JP | 09260650 A | 10/1997 |
| JP | H11154748 A | 6/1999 |
| JP | 2000031484 A | 1/2000 |
| JP | 2000277734 A | 10/2000 |
| JP | 2007080971 A | 3/2007 |
| JP | 2007129259 A | 5/2007 |
| JP | 2007221012 A | 8/2007 |
| JP | 2008505480 A | 2/2008 |
| JP | 2008108824 A | 5/2008 |
| JP | 2008159916 A | 7/2008 |
| JP | 2009117593 A | 5/2009 |
| JP | 2009117649 A | 5/2009 |
| JP | 2009187966 A | 8/2009 |
| JP | 2010541288 A | 12/2010 |
| JP | 2011049267 A | 3/2011 |
| JP | 2012044167 A | 3/2012 |
| JP | 2012151470 A | 8/2012 |
| JP | 2013214661 A | 10/2013 |
| JP | 2014003191 A | 1/2014 |
| JP | 2014075582 A | 4/2014 |
| JP | 2014107571 A | 6/2014 |
| JP | 2014165348 A | 9/2014 |
| JP | 2015226060 A | 12/2015 |
| WO | 03010812 A1 | 2/2003 |
| WO | 03019623 A2 | 3/2003 |
| WO | 2011151901 A1 | 12/2011 |

OTHER PUBLICATIONS

Jiang, Huaping, et al., "SiC MOSFET with Built-in SBD for Reduction of Reverse Recovery Charge and Switching Loss in 10-KV Applications", Proceedings of The 29th International Symposium on Power Semiconductor Devices & CS, Sapporo, Japan, May 28-Jun. 1, 2017, pp. 49-52.

Kawahara, Koutarou, et al., "6.5 kV Schottky-Barrier-Diode-Embedded SiC-MOSFET for Compact Full-Unipolar Module", Proceedings of The 29th International Symposium on Power Semiconductor Devices & ICs, Sapporo, Japan, May 28-Jun. 1, 2017, pp. 41-44.

Unknown, Author, "CMF20120D—Silicon Carbide Power Mosfet 1200V 80 mΩ: Z-Fet MOSFET N-Channel Enhancement Mode", CMF20120D Rev. A, Cree, Inc., Jan. 13, 2012.

* cited by examiner

_US 12,471,336 B2_

SEMICONDUCTOR COMPONENT HAVING A SiC SEMICONDUCTOR BODY

TECHNICAL FIELD

The present application relates to semiconductor components comprising a SiC semiconductor body, in particular semiconductor switches having a low on resistance and a high dielectric strength, and to methods for producing semiconductor components.

BACKGROUND

Power semiconductor components carry a comparatively high load current in conjunction with a high dielectric strength. In power semiconductor components having a vertical structure, the load current flows between two mutually opposite main surfaces of a semiconductor body, wherein it is possible to set the current-carrying capacity by the horizontal extent of the semiconductor body and the dielectric strength by way of the vertical extent of a drift zone formed in the semiconductor body. In power semiconductor switches such as MOSFETs (metal oxide semiconductor field effect transistors) and IGBTs (insulated gate bipolar transistors), a gate electrode couples into body regions capacitively by way of a gate dielectric and switches the load current e.g. as a result of temporarily forming an inversion channel in the body regions. In semiconductor bodies composed of a material having an intrinsically high breakdown field strength, such as silicon carbide (SiC), for example, the gate dielectric is exposed to a strong electric field in off-state case, and so the breakdown strength of the gate dielectric can prescribe the voltage up to which the dielectric strength of the semiconductor switch can be set by the vertical extent of the drift zone.

Endeavors are generally made to further improve the breakdown strength of semiconductor components without losses viz-a-vis the on resistance.

SUMMARY

The present disclosure relates to a method for producing a semiconductor component. A silicon carbide substrate is provided, wherein the silicon carbide substrate has a trench extending from a main surface of the silicon carbide substrate into the silicon carbide substrate and having a trench width at a trench bottom. A shielding region is formed in the silicon carbide substrate, wherein the shielding region extends along the trench bottom. In at least one doping plane extending approximately parallel to the trench bottom, a dopant concentration in the shielding region over a lateral first width deviates by not more than 10% from a maximum value of the dopant concentration in the shielding region in the doping plane. The first width is less than the trench width and is at least 30% of the trench width.

The present disclosure furthermore relates to a semiconductor component that can comprise a SiC semiconductor body and a gate electrode structure. The gate electrode structure can extend from a first surface of the SiC semiconductor body into the SiC semiconductor body and have a conductive connection structure. The gate electrode structure has a structure width at a bottom. A shielding region can be formed in the SiC semiconductor body along the bottom. The conductive connection structure and the shielding region can form a contact. The shielding region can have a central section having a first width. In at least one doping plane extending approximately parallel to the bottom, a dopant concentration in the central section of the shielding region deviates by not more than 10% from a maximum value of the dopant concentration in the shielding region in the doping plane. The central section of the shielding region has a first width that is less than the structure width and is at least 30% of the structure width.

Further features and advantages of the subject matter disclosed will become apparent to the person skilled in the art from the following detailed description and from the drawings.

BRIEF DESCRIPTION OF THE DRAWINGS

The accompanying drawings convey a deeper understanding of exemplary embodiments for a semiconductor component and for a method for producing a semiconductor component, are included in the disclosure and form a part thereof. The drawings merely illustrate exemplary embodiments and together with the description serve to elucidate their principles. Consequently, the semiconductor component and the method described here are not restricted to the exemplary embodiments by the description thereof. Further exemplary embodiments and intended advantages are evident from the understanding of the following detailed description and from combinations of the exemplary embodiments described below, even if they are not explicitly described. The elements and structures shown in the drawings are not necessarily illustrated in a manner true to scale with respect to one another. Identical reference signs refer to identical or mutually corresponding elements and structures.

DETAILED DESCRIPTION

Figure 1:
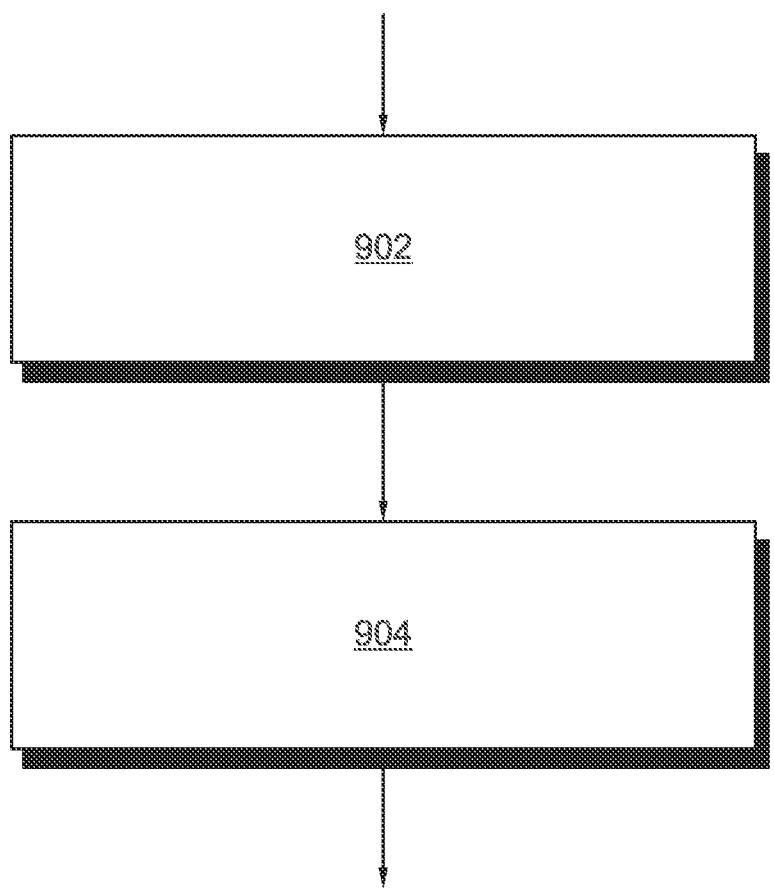
FIG. 1 is a simplified schematic flow diagram for illustrating a method for producing a semiconductor component in accordance with one exemplary embodiment.

In the following detailed description, reference is made to the accompanying drawings, which form part of the disclosure and show specific exemplary embodiments of a semiconductor component and of a method for producing a semiconductor component for illustration purposes. It goes without saying that further exemplary embodiments exist. It likewise goes without saying that structural and/or logical changes can be made to the exemplary embodiments, without in so doing departing from what is defined by the patent claims. The description of the exemplary embodiments is non-limiting in this respect. In particular, features of exemplary embodiments described below can be combined with features of others of the exemplary embodiments described, provided that nothing to the contrary is evident from the context.

The terms "have", "contain", "encompass", "comprise" and the like hereinafter are open terms which on the one hand indicate the presence of the stated elements or features, and on the other hand do not exclude the presence of further elements or features. The indefinite articles and the definite articles encompass both the plural and the singular, unless something to the contrary is clearly evident from the context.

A safe operating area (SOA) defines ambient and operating conditions for which fail-safe operation of a semiconductor component can be expected. The safe operating area is typically defined by the specification of maximum values for ambient and operating conditions in a data sheet for the semiconductor component, e.g. maximum continuous load current, maximum pulsed load current, maximum gate voltage, maximum reverse voltage, and so on.

The term or expression "electrically connected" describes a resistive, e.g. a low-resistance, connection between the electrically connected elements, for example a direct contact between the relevant elements or a connection via a metal and/or a highly doped semiconductor. The expression "electrically coupled" includes the fact that one or more intervening elements suitable for transmitting signals can be present between the "electrically coupled" elements, e.g. elements that are controllable such that they can establish at times a low-resistance connection in a first state and a high-resistance decoupling in a second state.

Hereinafter the wording "form a contact" should be understood such that during operation of a semiconductor component within the SOA, between two structures that form a contact, at least one type of charge carriers can cross from one structure into the other structure. In other words: there is a contact between the two structures. Typically, the structures directly adjoin one another. A region in which the structures form the contact, e.g. adjoin one another, is also referred to hereinafter as "contact region".

An ohmic contact denotes e.g. a junction between two structures with low electrical resistance and without a rectifying effect. An ohmic contact can be formed for example between a structure composed of a metal and a sufficiently highly doped structure comprised of a semiconductor material. An ohmic contact region denotes the contact region, e.g. the contact pad, of an ohmic contact.

Schottky contact hereinafter denotes a junction having a rectifying effect between a semiconductor material and a metal structure, wherein e.g. the doping of the semiconductor material and the work function of the metal structure are chosen such that in the case of equilibrium along the interface a depletion zone forms in the semiconductor material. A Schottky contact region denotes the contact region, e.g. the contact pad, of a Schottky contact.

Some figures represent relative dopant concentrations by the indication "−" or "+" next to the doping type. By way of example, the designation "n−" denotes a dopant concentration which is less than the dopant concentration of an "n"-doped region, while an "n+"-doped region has a higher dopant concentration than the "n"-doped region. The indication of the relative dopant concentration does not mean that doped regions with the same relative dopant concentration indication must have the same absolute dopant concentration, unless stated otherwise. Accordingly, two different "n"-doped regions can have the same or different absolute dopant concentrations.

If a value range with the indication of one limit value or two limit values is defined for a physical variable, then the expressions "from" and "to" or "less" and "more" include the respective limit value. An indication of the type "from . . . to" is accordingly understood as "from at least . . . to at most". Correspondingly, an indication of the type "less . . . " ("more . . . ") is understood as "at most . . . " ("at least . . . ").

The abbreviation IGFET (insulated gate field effect transistor) denotes voltage-controlled semiconductor switches and encompasses not only MOSFETs (metal oxide semiconductor FETs) but also such FETs whose gate electrode comprises doped semiconductor material and/or whose gate dielectric does not comprise oxide or does not exclusively consist of an oxide.

Two doped regions adjoining one another and having the same doping type (conductivity type) and having different dopant concentrations form a unipolar junction, e.g. an n/n+ or a p/p+ junction, along a junction surface. At the unipolar junction a dopant profile extending perpendicular to the junction has a step or a point of inflection at which the dopant profile transitions from a concave profile to a convex profile or from a convex to a concave profile.

One exemplary embodiment relates to a method for producing a semiconductor component. The method can comprise providing a silicon carbide substrate, wherein the silicon carbide substrate has a trench extending from a main surface of the silicon carbide substrate into the silicon carbide substrate and having a trench width at the trench bottom. A shielding region can be formed in the silicon carbide substrate, wherein the shielding region can extend along the trench bottom.

The wording according to which the shielding region "extends" along the trench bottom does not restrict a main extension direction of the shielding region. Rather, this can be interpreted such that the shielding region runs along the trench bottom and/or that a lateral total width of the shielding region corresponds to at least 80% of a trench width. It is possible for the main extension direction of the shielding region to run along a vertical direction. By way of example, the shielding region can extend vertically through a large portion, e.g. at least 60%, of a drift zone of the semiconductor component to be produced.

In at least one doping plane extending approximately parallel to the trench bottom a dopant concentration in the shielding region over a lateral first width can deviate by not more than ±10% from a maximum value of the dopant concentration in the shielding region in the doping plane. Typically, the dopant concentration in the shielding region in the doping plane over a lateral first width deviates by not more than ±5% or by not more than ±1% from a maximum value of the dopant concentration in the shielding region in the doping plane. In other words, at least one horizontal doping distribution of the shielding region has a plateau having the first width, wherein within the plateau the dopant concentration fluctuates by a maximum of ±10%, e.g. by a maximum of ±5% or by a maximum of ±1%. The region of the shielding region over the lateral first width can be a central section of the shielding region.

The trench bottom can comprise a planar section in a bottom plane. The bottom plane can extend parallel to the main surface or the bottom plane and the main surface can form an angle of between 0° and 10°, e.g. an angle of between 0° and 5°. The doping plane can extend parallel to the bottom plane or the bottom plane and the doping plane can form an angle of between 0° and 10°, e.g. an angle of between 0° and 5°.

The first width can be less than the trench width, for example less than the trench width by at least 50 nm or at least 150 nm and/or by at least 2% or at least 5%. By way of example, the first width can be a maximum of 99%, a maximum of 95% or a maximum of 90% of the trench width. It is possible for the first width to be at least 30% of the trench width.

Outside the central section, the dopant concentration in the shielding region can fall steeply in a lateral direction, such that the shielding region cannot project, or can project only to a very small extent, laterally beyond the gate electrode structure. By way of example, a lateral total width of the shielding region deviates by at most ±20% or by at most ±10% from the trench width. The shielding region does not reduce, or only slightly reduces, a cross section of a current distribution region that can laterally adjoin the gate electrode structure.

In accordance with one embodiment, the doping plane can connect laterally adjacent local maximum values of vertical dopant distributions in the shielding region. A distance between the trench bottom and the doping plane can correspond in this case to a penetration depth of the dopant atoms into the silicon carbide substrate, wherein the penetration depth (called: projected range) is dependent on the kinetic energy of the dopant atoms and specifies the average range of from the dopant atoms proceeding from the surface through which said atoms are introduced. By way of example, the distance can be in a range of from 20 nm to 500 nm, typically in a range of from 50 nm to 300 nm.

In accordance with this embodiment, e.g. the maximum dopant concentration in the shielding region across the lateral first width can have a dopant plateau in which the dopant concentration fluctuates by a maximum of ±10%, e.g. by a maximum of ±5% or by a maximum of ±1%, of the maximum value in the shielding region.

In accordance with one embodiment, a field dielectric can be formed in the trench, wherein the field dielectric has an opening having a lateral second width at the trench bottom. The second width can be less than the first width. The first and second widths can be defined along the same lateral direction.

Edges of the field dielectric toward the opening can be completely shielded by at least one part of the central section of the shielding region. Sections of the field dielectric toward the opening can therefore be effectively shielded from a potential of a rear-side electrode. High electric field strengths in sections of the field dielectric which directly adjoin the opening can be avoided.

In accordance with one embodiment, the field dielectric can have a sidewall section having a first layer thickness th1 along a sidewall of the trench and the opening can have a second width w2, for which the following can hold true:

$$w2<(wg-2*th1),$$

where wg is equal to the trench width. In words: the second width is less than the difference between the trench width and twice the first layer thickness. This can have the effect that edges of the field dielectric toward the opening can be effectively shielded by a section of the shielding region in which the dopant concentration does not fall.

The sidewall section of the field dielectric can extend as far as the trench bottom. It is thus possible for a part of the sidewall section to cover the trench bottom and/or to terminate at the trench bottom. The field dielectric can have two sidewall sections, for example embodied in an identical way, wherein each sidewall section extends along one of the sidewalls of the field dielectric.

It is possible, proceeding from the sidewall section, for a bottom section of the field dielectric to extend laterally along the trench bottom. The bottom section can be assigned to the sidewall section, that is to say can be directly connected thereto. In the case of a plurality of sidewall sections, each sidewall section can be assigned a bottom section, wherein the bottom section proceeding from the sidewall section assigned thereto extends along the trench bottom. The field dielectric can have two sidewall sections and two bottom sections, for example.

The sidewall section together with the bottom section assigned thereto can be embodied in an L-shaped fashion. A part of the field dielectric that extends along the trench bottom can be formed from the bottom section and the part of the sidewall section that covers the trench bottom. The bottom section can be arranged between the side section and the opening in the trench bottom. By way of example, a distance between the opening and the sidewall section can be bridged by means of the bottom section.

The bottom section can have a lateral bottom width along the trench bottom. Perpendicular to the bottom width, the bottom section can have a second layer thickness. The bottom width can at least partly, in particular completely, compensate for the difference between the second width of the opening and the trench width, and twice the first layer thickness. The bottom width can correspond to half the difference between the trench width and the second width, minus the first layer thickness:

$$wb=\frac{1}{2}*(wg-w2)-th1,$$

wherein wb is the bottom width of the bottom section. In other words: the sum of the bottom width and the first layer thickness can correspond to half the difference between the trench width and the second width.

The respective factor 2 and inversely the factor ½ in the above-described relations of the trench width, the second width, the first layer thickness and (optionally) the bottom width can stem from the fact that the field dielectric can have two sidewall sections, wherein the sidewall sections can be formed at opposite sidewalls of the trench.

The two sidewall sections of a trench can be formed differently. Independently of the number of sidewall sections of a trench, sidewall sections of different trenches can be formed differently, wherein—if the trench has a plurality of sidewall sections—the sidewall sections of a trench can be formed identically or differently.

By way of example, two sidewall sections can have different first layer thicknesses, wherein for each of the first layer thicknesses the above relation with respect to the difference between the trench width and the second width can be fulfilled independently.

Each sidewall section can be assigned a bottom section. The bottom sections of different sidewall sections can have different or identical bottom widths. In the first case, it is possible for the sum of the first layer thickness of the sidewall section and the bottom width of the bottom section assigned to the sidewall section to remain constant for different side sections (and thus also different bottom sections). By way of example, a thicker sidewall section can thus be compensated for by a narrower bottom section, and vice versa. In the second case, where different bottom sections have identical bottom widths, it may be possible for the sum of the first layer thickness of the sidewall section and the bottom width of the bottom section assigned to the sidewall section to be different for different side sections. By way of example, in this case, the opening is formed in a manner not centered in relation to the trench.

A central section of the shielding region in which the dopant concentration is uniformly high can reach laterally beyond the opening in the field dielectric. An edge of the field dielectric toward the opening can be completely covered by the central section of the shielding region. An edge between a conductive structure, which can adjoin the shielding region in the region of the opening in the field dielectric, the shielding region and the field dielectric can be effectively shielded from a drain potential. The central section of the shielding region can reduce the maximum electric field strength in the field dielectric and/or the probability of a breakdown through the field dielectric.

In accordance with one embodiment, forming the shielding region can comprise forming an implantation mask, wherein the implantation mask is formed such that it is thinner at the trench bottom than at sidewalls of the trench, and wherein the dopant atoms are introduced through the trench bottom and/or through the implantation mask at the trench bottom.

By way of example, forming the implantation mask can comprise thermally growing an oxide, wherein the thermal oxide grows at a lower rate at the trench bottom by comparison with the sidewalls. The shielding region can be formed without an additional lithography process.

During the process of introducing the dopant atoms for the shielding region, the implantation mask can largely prevent the spreading of dopant atoms through sidewalls of the trench. For example, such dopant atoms that have spread into a body region can influence a threshold voltage for forming an inversion channel in the body region. Dopant atoms that have spread into a current distribution region can increase the electrical resistance of the current distribution region and thus the on resistance of a semiconductor component. The implantation mask can prevent such doped regions from being subjected to dopant atoms whose amount and exact localization in the silicon carbide substrate would be subject to great fluctuations. By way of the implantation mask, for example in conjunction with an implantation energy used, the first width in the shielding region can also be set precisely.

In accordance with one embodiment, forming the shielding region can comprise forming an implantation mask, wherein the implantation mask can have an implantation mask opening having a third width at the trench bottom and the dopant atoms can be introduced through the implantation mask opening. The third width is greater than the first width, wherein the first width can be set precisely by way of the third width and process parameters of the implantation.

Introducing the dopant atoms can comprise one or a plurality of ion implantation processes, wherein each ion implantation process can comprise a plurality of implantations with the same acceleration energy and at different implantation angles, and wherein the ion implantation processes differ with regard to the acceleration energies used. Each implantation process can comprise implantations for at least two different implantation angles, each of which can be symmetrical with respect to a center plane of the trench.

In accordance with one embodiment according to which the doping plane connects laterally adjacent local maximum values of vertical dopant distributions in the shielding region, it is possible for the first width to deviate by not more than ±10% from a difference between the third width and twice an average distance between the doping plane and the trench bottom. The average distance between the trench bottom and the doping plane can correspond to the average penetration depth of dopant ions during an ion implantation. By way of the third width and the penetration depth, the first width and thus the lateral extent of the uniformly and highly doped central section of the shielding region below the trench bottom can be set precisely and aligned with the opening in the field dielectric.

In accordance with one embodiment, forming the implantation mask can comprise forming an implantation mask layer on sidewalls and at the trench bottom of the trench, and removing a section of the implantation mask layer at the trench bottom, wherein a remaining section of the implantation mask layer can form the implantation mask.

Forming the implantation mask can comprise, in particular, anisotropically etching a conformal implantation mask layer, wherein the first width can be set precisely by way of the layer thickness of the conformal implantation mask layer and the width of the trench. A conformal layer covers a structured support with uniform layer thickness, which is largely independent of the orientation of partial sections of the support with respect to one another. The layer thickness of a conformal layer can have slight fluctuations that are small relative to an average layer thickness of the conformal layer (for example at most ±10% of the average layer thickness). A conformal layer can be formed for example by means of a thin-film deposition method, e.g. CVD (chemical vapor deposition).

In accordance with one embodiment, introducing dopant atoms can comprise implantations for at least two different acceleration energies, wherein the width of the implantation mask opening can be altered between the implantations.

In particular, it is possible to carry out an implantation with a higher acceleration energy in the case of a smaller width of the implantation mask opening and an implantation with a low acceleration energy in the case of a larger width of the implantation mask opening.

Implantations with a higher acceleration energy can form a vertically extended JFET (junction field effect transistor) structure. Implantations at a low acceleration energy can be designed such that the opening of the field dielectric is at a sufficient distance from the outer lateral edge of the shielding region.

In accordance with one embodiment, the implantation mask can be removed before the process of forming the field dielectric. Field dielectric and implantation mask can thus be formed independently of one another and be chosen in accordance with the respective requirements.

In accordance with one embodiment, forming the field dielectric can comprise forming a field dielectric layer, wherein the field dielectric layer lines the trench, and a section of the field dielectric layer is removed at the trench bottom.

In accordance with one embodiment, removing the section of the field dielectric layer can comprise forming an etching mask on the field dielectric layer, wherein the etching mask can have an etching mask opening having the second width above the trench bottom. The second width can be set precisely by way of the layer thickness of the etching mask.

The etching mask can be for example a layer, in particular a conformal layer, which covers, for example completely covers, the sidewall sections of the field dielectric and a bottom section to be produced of the field dielectric at the trench bottom. The layer thickness of the etching mask can correspond to the bottom width of the bottom section.

In accordance with one embodiment, a conductive connection structure can be formed in the trench, wherein the connection structure and the shielding region can form a contact.

The connection structure can be formed with an electrically conductive material, such as, for example, a metal or a semiconductor (e.g. a very highly doped or degenerate semiconductor, such as e.g. polycrystalline silicon). The connection structure can contain a plurality of layers, wherein layers directly adjoining one another consist of different materials.

The contact between the connection structure and the shielding region can be an ohmic contact that enables charge carriers to be led away from the shielding region via the connection structure to a load electrode.

A further exemplary embodiment relates to a semiconductor component, which can comprise a SiC semiconductor body and a gate electrode structure. The gate electrode structure can extend from a first surface of the SiC semiconductor body into the SiC semiconductor body and have a conductive connection structure. At a bottom the gate electrode structure has a structure width. A shielding region can be formed in the SiC semiconductor body along the bottom. A contact can be formed between the conductive connection structure and the shielding region, e.g. an ohmic contact or a contact having a nonlinear characteristic, e.g. a Schottky contact.

The shielding region can have a central section having a first width. In at least one doping plane extending approximately parallel to the trench bottom a dopant concentration in the central section deviates by not more than ±10%, typically by not more than ±5% or by not more than ±1%, from a maximum value in the doping plane. The first width is less than the structure width and is at least 30% of the structure width.

Exemplary embodiments of the semiconductor component can have been produced by exemplary embodiments of the method as described here. That is to say that all features described in association with exemplary embodiments of the method can be correspondingly disclosed for the semiconductor component and vice versa. By way of example, the bottom of the gate electrode structure can arise from the trench bottom in a production method. The SiC semiconductor body can arise from the silicon carbide substrate. The structure width can correspond to the trench width.

The first width of the central section can be set by way of the width of an opening in an implantation mask which was used in a method for producing the semiconductor component for introducing dopant atoms through a trench bottom of a trench for the purpose of forming the shielding region, wherein the gate electrode structure was formed in the trench.

Outside the central section, the dopant concentration in the shielding region can fall greatly in a lateral direction, such that the shielding region cannot project, or can project only to a very small extent, laterally beyond the gate electrode structure. The shielding region does not reduce, or reduces only to a small extent, a cross section of a current distribution region that can laterally adjoin the gate electrode structure.

During the process of introducing dopant atoms for forming the shielding region, it is possible to suppress the spreading of dopant atoms through sidewalls of a trench in which the gate electrode structure is formed into doped regions that laterally adjoin the gate electrode structure.

In accordance with one embodiment, the doping plane can connect local maximum values of vertical dopant distributions in the shielding region. In this case, an average distance between the trench bottom and the doping plane can correspond to a penetration depth of the dopant atoms into the silicon carbide substrate. In accordance with this embodiment, the maximum dopant concentration in the shielding region across the lateral first width can have a dopant plateau in which the doping concentration fluctuates by a maximum of ±10%, e.g. by a maximum of ±5% or by a maximum of ±1%, of the maximum value in the dopant plane.

In accordance with one embodiment, the first width can be less than a difference between the structure width and twice the average distance between the doping plane and the bottom, for example less than or equal to a difference between the structure width and two and a half times or three times the average distance between the doping plane and the bottom. Accordingly, forming the shielding region can comprise an ion implantation in which an implantation mask covers sidewalls of the trench and at least partly prevents dopant ions from being introduced at an undesired location. By way of example, when forming the shielding region after forming a trench for the gate electrode and before forming the gate electrode in the trench, it is possible to reduce or completely avoid the penetration of dopants through a trench sidewall and through an outer section of the trench bottom into a body region or into a section of a drift zone or of a current distribution region, which section is adjacent to the body region toward the drain side.

In accordance with one embodiment, the gate electrode structure can have a field dielectric. The field dielectric can have a sidewall section having a first layer thickness th1 along a sidewall of the gate electrode structure. The connection structure can have at the bottom a second width w2, which can be less than the difference between the structure width w0 of the gate electrode structure at the bottom and twice the first layer thickness: $w2<(w0-2 \cdot th1)$.

The contact between the connection structure and the shielding region can be formed completely by the central section of the shielding region and/or by an end region of the connection structure at the bottom. In this case, a contact region between the connection structure and the shielding region can extend completely along the shielding region and/or the end region of the connection structure.

The central section of the shielding region shields the contact region and sections of the field dielectric that directly adjoin the contact region from a potential of a rear-side electrode. The sections of the field dielectric can be the bottom sections, for example. High electric field strengths in sections of the field dielectric that directly adjoin the contact region can be avoided. During operation of the semiconductor component in the SOA, the lateral withdrawal of the contact region relative to the outer edges of the shielding region can reduce the maximum electric field strength in the field dielectric, decrease the probability of a breakdown of the field dielectric and increase the reliability of the semiconductor component.

In accordance with one embodiment, the field dielectric can have along the bottom a bottom section having a second layer thickness, which is less than or equal to the first layer thickness. The bottom section can be formed in an outer section of the bottom between a part of the connection structure and the shielding region. It is possible for the shielding region, in particular the central region thereof, laterally to overlap the field dielectric, in particular the bottom section thereof. The bottom section can withdraw the contact region between the connection structure and the shielding region from a lateral outer edge of the central section of the shielding region, wherein the electric field that occurs in sections of the field dielectric along the contact region can be reduced. The second layer thickness of the field dielectric can vary over the distance; e.g. the layer thickness can decrease in the direction toward the connection structure.

In accordance with one embodiment, a JFET partial region can be formed in the SiC semiconductor body. The JFET partial region and the shielding region can form a unipolar junction. The shielding region is formed between the gate electrode structure and the JFET partial region. At the unipolar junction the JFET partial region has a fourth lateral width, which is less than the first width.

The lateral withdrawal of the JFET partial region makes it possible to realize JFET partial regions having a comparatively large vertical extent, without the cross section of a current distribution region that can laterally adjoin the JFET partial region being reduced or being reduced more than to only a small extent.

In accordance with a further embodiment, the gate electrode structure can comprise a gate electrode and an isolation dielectric, wherein the gate electrode is formed between the first surface and the connection structure and wherein the isolation dielectric is formed between the gate electrode and the connection structure.

In at least one embodiment of a method described here and/or of a semiconductor component described here, at least one of the following features (if applicable) can hold true:

A bottom section of the field dielectric can extend along the bottom and/or along the trench bottom proceeding from the sidewall section.

The bottom section can be arranged between the sidewall section and the opening in the trench bottom.

The difference between the bottom width of the bottom section and the first layer thickness of the sidewall section can correspond to half the difference between the trench width and the second width.

The sidewall section of the field dielectric together with the bottom section of the field dielectric can be formed in an L-shaped fashion.

The sidewall section of the field dielectric can be formed integrally with the bottom section of the field dielectric.

The shielding region, for example its central section, can laterally overlap the field dielectric, for example the bottom section thereof.

The bottom section can partly cover the central section of the shielding region.

(viii) The connection structure and the shielding region can directly adjoin one another.

In accordance with FIG. 1, a method for producing a semiconductor component comprises providing a silicon carbide substrate (902), wherein the silicon carbide substrate has a trench and the trench extends from a main surface of the silicon carbide substrate into the silicon carbide substrate and has a trench width at a trench bottom. A shielding region is formed (904) in the silicon carbide substrate, wherein the shielding region extends along the trench bottom. In at least one doping plane extending approximately parallel to the trench bottom a dopant concentration in the shielding region over a lateral first width deviates by not more than 10%, by not more than 5% or by not more than 1% from a maximum value of the dopant concentration in the doping plane. The first width is less than the trench width and is at least 30% of the trench width.

FIGS. 2A to 2D relate to a method for producing a semiconductor component made from a silicon carbide substrate 700.

The silicon carbide substrate 700 can comprise or consist of a SiC crystal. The polytype of the SiC crystal can be for example 15R or a hexagonal polytype, e.g. 2H, 4H or 6H. Besides the main constituents of silicon and carbon, the silicon carbide substrate 700 can comprise dopant atoms, for example nitrogen (N), phosphorus (P), beryllium (Be), boron (B), aluminum (Al), and/or gallium (Ga). In addition, the silicon carbide substrate 700 can comprise impurities, for example oxygen, hydrogen, fluorine and/or bromine.

The silicon carbide substrate 700 can form a so-called semiconductor wafer, that is to say an approximately circular, flat slice having a main surface 701 on the front side and a rear-side surface 702 on the rear side of the slice, wherein the rear-side surface 702 and the main surface 701 are oriented parallel to one another.

The main surface 701 can be planar or ribbed. For the case of a ribbed main surface, a center plane through the ribbed main surface is deemed hereinafter to be the main surface 701.

A surface normal 704 to the main surface 701 defines a vertical direction. Directions orthogonal to the surface normal 704 are lateral and horizontal directions. A diameter of the silicon carbide substrate 700 can correspond to an industry standard for semiconductor wafers, and be for example 2 inches, (51 mm), 3 inches (76 mm), 4 inches (100 mm), 125 mm or 200 mm.

The silicon carbide substrate 700 can comprise for example a heavily doped base substrate and an epitaxial layer grown on the base substrate, wherein the epitaxial layer can comprise a plurality of differently doped partial layers and doped regions. The doped regions can be formed in sections of one or more of the partial layers.

Trenches 750 are formed in the silicon carbide substrate 700, said trenches extending from the main surface 701 into the silicon carbide substrate 700.

Figure 2A:
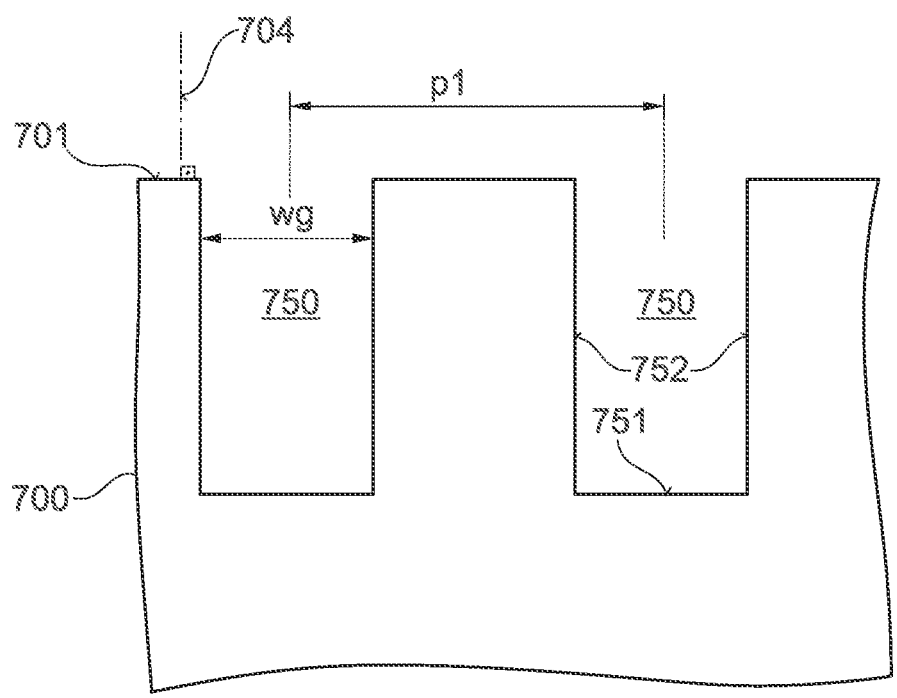
FIGS. 2A-2D schematically show vertical cross-sectional views of a silicon carbide substrate and a lateral dopant distribution of a shielding region in a doping plane for illustrating a method for producing a SiC semiconductor component in accordance with one embodiment.

FIG. 2A shows trenches 750 having a trench bottom 751 and having sidewalls 752, connecting the first main surface 701 to the trench bottom 751. The sidewalls 752 can be vertically aligned or can be vertically inclined. The trenches 750 can be formed in a strip-like fashion, wherein a length of the trenches 750 in a direction orthogonal to the cross-sectional plane is greater than a trench width wg of the trenches 750 parallel to the cross-sectional plane. Adjacent trenches 750 can be formed with in each case the same center-to-center distance (referred to as: pitch) p1 with respect to one another.

In each case a shielding region 140 is formed below the trenches 750 and in each case a field dielectric 159 having an opening 158 at the trench bottom 751 is formed in the trenches 750.

Figure 2B:
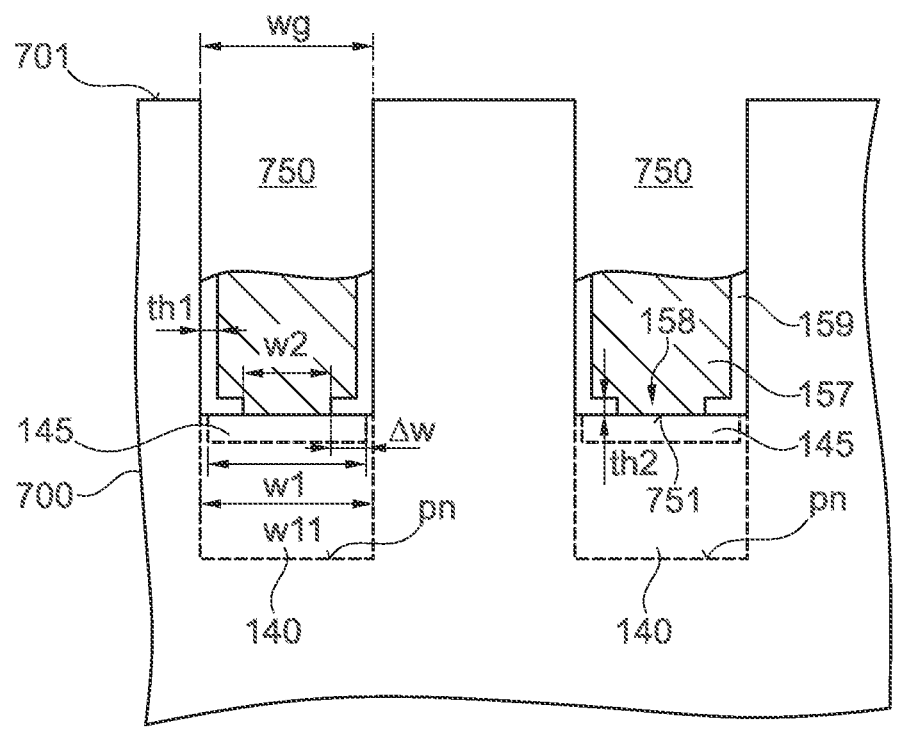
Figure 2C:
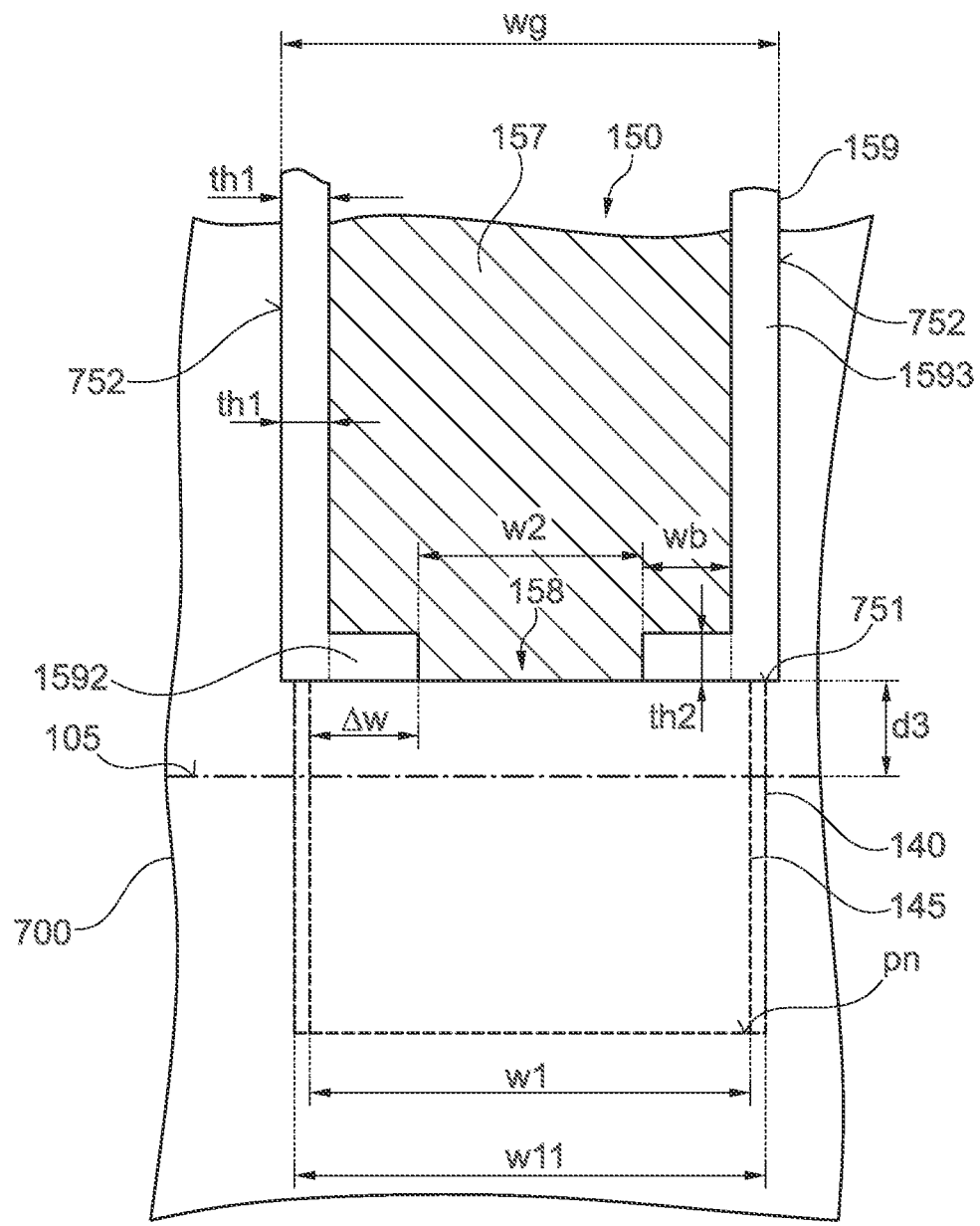

FIGS. 2B and 2C show shielding regions 140 which can in each case extend from the trench bottom 751 in a vertical direction into the silicon carbide substrate 700 and be formed symmetrically with respect to a center axis of the trenches 750. The shielding regions 140 and a drift structure formed in the silicon carbide substrate 700 can form pn junctions. The shielding regions 140 each have a central section 145 having a first width w1. In a dopant plane 105 parallel or approximately parallel to the trench bottom 751, within the central section 145 the dopant concentration deviates by a maximum of 10%, or by a maximum of 5% or by a maximum of 1%, from a maximum value in the central section 145 in the dopant plane 105.

Outside the central section 145, the dopant concentration in the shielding region 140 can decrease greatly in a lateral direction. The first width w1 is less than the trench width wg and less than a lateral total width w11 of the shielding region 140 in the plane of the trench bottom 751. The total width w11 of the shielding region 140 can be less than or equal to the trench width wg. The total width w11 of the shielding region 140 can assume a value in a range of from 500 nm to 3 µm.

The field dielectric 159 covers the sidewalls 752 and an outer section of the trench bottom 751 at least in a lower section of the trenches 750. The opening 158, which can be formed symmetrically with respect to a center axis of the trench 750, exposes a central section of the trench bottom 751. The opening 158 has a second width w2, which is less than the first width w1. A conductive connection structure 157 formed in the trench 750 directly adjoins the shielding region 140 in the region of the opening 158.

In accordance with FIG. 2C, the field dielectric 159 can have at least one sidewall section 1593 formed along one of the sidewalls 752 of the trench 750. The sidewall section 1593 has a first layer thickness th1 and directly adjoins the trench bottom 751 in a section of the trench bottom 751 proceeding from the sidewall 752 to a distance corresponding to the first layer thickness th1. The field dielectric 159 can have two sidewall sections 1593 formed on two mutually opposite sidewalls 752 of the trench 750, wherein the two sidewall sections 1593 can have different first layer thicknesses th1 or the same first layer thickness th1.

The field dielectric 159 can have at least one bottom section 1592, which can extend laterally along the trench bottom 751 proceeding from one of the sidewall sections 1593 wherein the bottom section 1592 can be directly connected to the sidewall section 1593. The bottom section 1592 extends over a bottom width wb from an edge of the opening 158 as far as the sidewall section 1593 and has a second layer thickness th2, which can be equal to, greater than or less than the first layer thickness th1. The lateral bottom width wb can assume a value in a range of from 30 nm to 400 nm, for example in a range of from 100 nm to 300 nm.

The sidewall section 1593 and the bottom section 1592 can be integral, i.e. form continuous sections of a unipartite structure. The bottom section 1592 and the sidewall section 1593 can consist of the same material or the same materials. In a vertical cross section transversely with respect to the trench 750, the sidewall section 1593 and the bottom section 1592 together can have an L-shaped cross-sectional area.

The field dielectric 159 can have two bottom sections 1592, wherein the two bottom sections 1592 can have different second layer thicknesses th2 or the same second layer thickness th2. The bottom sections 1592 can be formed asymmetrically or symmetrically with respect to the opening 158.

A total bottom width of all the bottom sections 1592 in a trench 750 having the trench width wg results by the first layer thicknesses th1 of the sidewall sections 1593 and the second width w2 of the opening 158 being subtracted from the trench width wg. For symmetrically formed sidewall sections 1593 having the same first layer thickness th1 and a symmetrical opening 158, the bottom width wb of a single bottom section 1592 results by the first layer thickness th1 being subtracted from half the difference between trench width wg and second width w2:

$$wb = \frac{1}{2} \ast (wg - w2) - th1$$

A distance Δw between an outer edge of the central section 145 of the shielding region 140 and the opening 158 in the field dielectric 159 is at least 25 nm and at most 300 nm, for example at least 75 nm.

Forming the shielding region 140 can comprise ion implantations at one or more acceleration voltages for dopant ions. The average range of the implanted dopant ions in the silicon carbide substrate 700 defines a penetration depth. A vertical dopant distribution in the shielding region 140 can be described by a Gaussian distribution or by the superposition of two or more Gaussian distributions. The distance between a local or global maximum of the vertical dopant distribution and the trench bottom 751 corresponds to a penetration depth prescribed by the acceleration voltage of an implantation.

A dopant plane 105, at a distance from the trench bottom 751, can connect locations of laterally adjacent local maxima of the vertical dopant distributions in the shielding region 140 to one another, e.g. the locations of the absolute maxima in the shielding region 140 or the locations of such local maxima which arise from the same implantation.

Figure 2D:
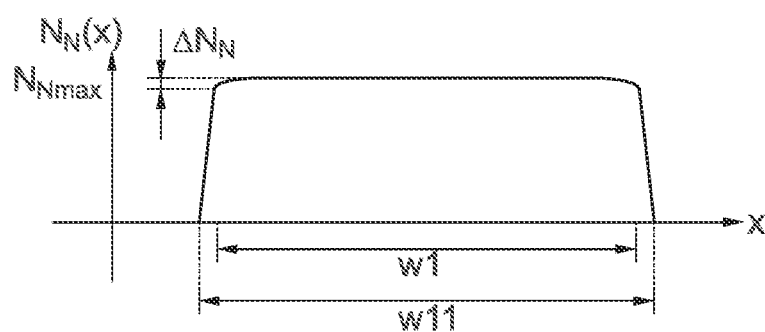

FIG. 2D shows a lateral dopant distribution in the dopant plane 105 from FIG. 2C. The doping type implanted into the shielding region 140 can predominate over the lateral total width w11 of the shielding region 140. Over a lateral first width w1 the dopant concentration deviates by not more than 10% from the maximum dopant concentration in the doping plane 105.

The lateral first width w1 is less than the lateral total width w11 and can be less than or equal to the difference between the trench width wg and double the penetration depth d3, e.g. less than or equal to the difference between the trench width wg and two and a half times or three times the penetration depth.

The relatively highly and uniformly doped central section 145 of the shielding region 140 effectively shields an edge between field dielectric 159, connection structure 157 and shielding region 140 from the potential of a load electrode, on a rear side of the silicon carbide substrate facing away from the main surface 701.

FIGS. 3A-3L show one exemplary embodiment with gate electrode structures comprising, in addition to a conductive gate electrode, a conductive connection structure, which can be electrically connected or electrically coupled to a doped shielding region below the gate electrode structure and to a front-side metallization on the front side of the silicon carbide substrate.

Figure 3A:
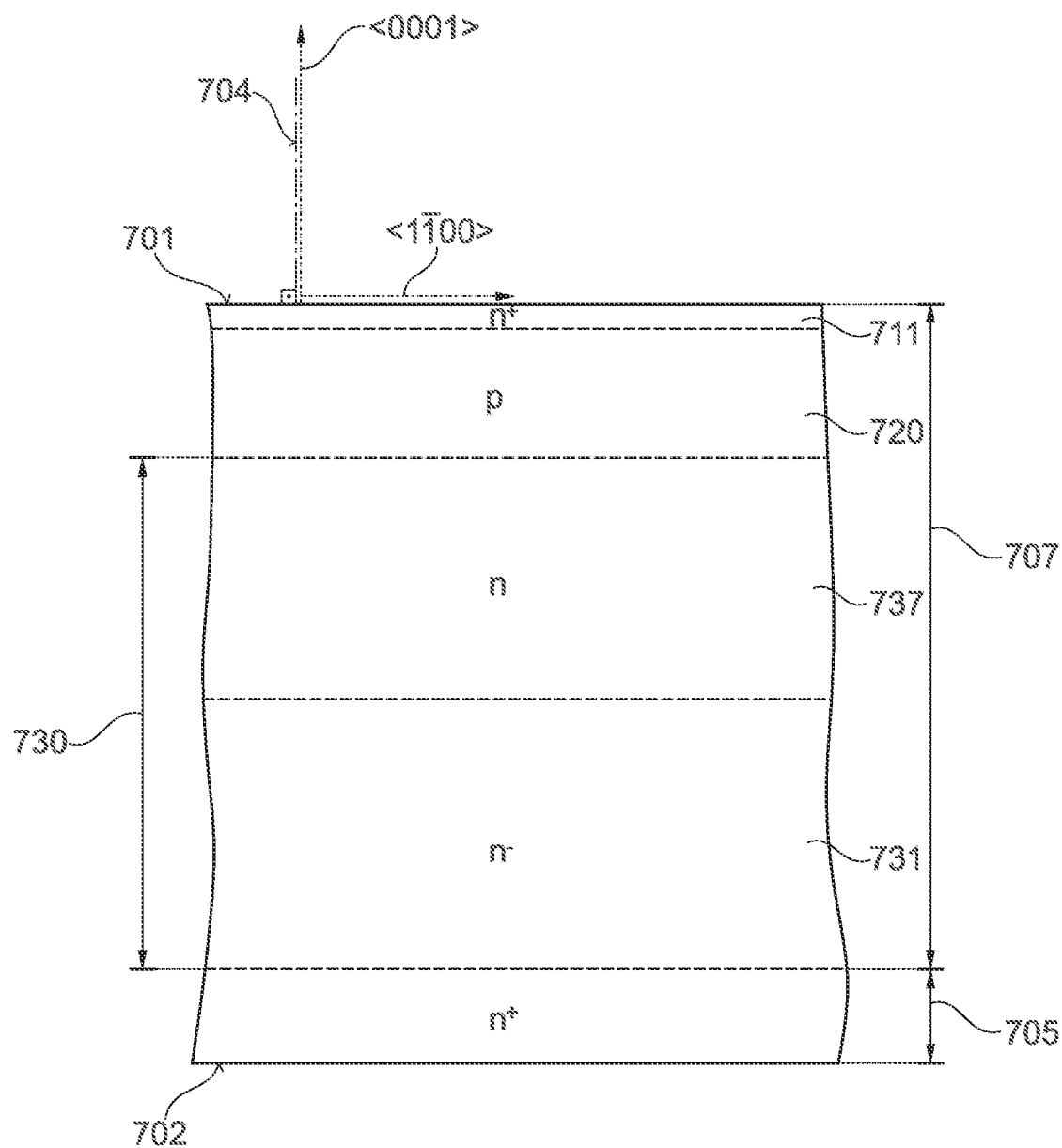
FIGS. 3A-3L show schematic vertical cross-sectional views of a silicon carbide substrate for illustrating a method in accordance with one embodiment in which dopant atoms for forming shielding regions are introduced into gate trenches by means of an implantation mask.

FIG. 3A shows a silicon carbide substrate 700 which is based on a hexagonal SiC crystal type, e.g. 4H-SiC, and the <0001> lattice direction of which is tilted by an offset angle α relative to the surface normal 704 to the main surface 701. The offset angle α can be between 2° and 8°, e.g. approximately 4°.

The cross-sectional planes in FIGS. 3A-3L are chosen such that the <0001> lattice direction in a plane oriented orthogonally to the cross-sectional plane and orthogonally to the main surface 701 is tilted by the offset angle α relative to the surface normal 704. The <11-20> lattice direction in the plane oriented orthogonally to the cross-sectional plane and orthogonally to the main surface 701 is tilted by the offset angle α relative to a surface normal to the cross-sectional plane. The <1-100> lattice direction runs parallel to the cross-sectional plane and parallel to the main surface 701. In the exemplary embodiments shown in FIGS. 2A-2C, 3A-3L, 4A-4B, 5A-5B, 6 and 8 the <1-100> lattice direction runs in each case perpendicular to a main extension direction of the trenches and/or gate electrode structures. However, it is alternatively possible for the <11-20> lattice direction to run perpendicular to a main extension direction of the trenches and/or the gate electrode structures (cf. e.g. FIG. 7).

For further properties of the silicon carbide substrate 700, reference is also made to the description of FIGS. 2A to 2C.

The silicon carbide substrate 700 can comprise a base substrate 705 and/or an epitaxial layer 707. The base substrate 705 can be a silicon carbide wafer separated from a monocrystalline silicon carbide crystal for example by means of sawing or by a wafer cleaving method. The base substrate 705 can be heavily doped, for example heavily n-doped. However, the silicon carbide substrate 700 can also be free of a base substrate 705, for example since the latter was removed from the epitaxial layer 707 after the growth thereof.

The epitaxial layer 707 can be formed by an epitaxial method on a process surface of the base substrate 705. The epitaxial layer 707 can have a drift layer structure 730, which can have the same conductivity type as the base substrate 705 or the complementary conductivity type with respect to the conductivity type of the base substrate 705.

The drift layer structure 730 can comprise a weakly doped drift layer 731 and an optional current distribution layer 737, wherein the drift layer 731 can be formed between the base substrate 705 and the current distribution layer 737. The drift layer 731 and the optional current distribution layer 737 have the same conductivity type. An average dopant concentration in the optional current distribution region 737 is higher than in the drift layer 731. By way of example, the average dopant concentration in the optional current distribution layer 737 can be at least double the average dopant concentration in the drift layer 731.

A body structure 720 can be formed on a side of the drift layer structure 730 opposite the base substrate 705, said body structure having a conductivity type opposite to the conductivity type of the drift layer structure 730. The body structure 720 can for example be grown by means of epitaxy on the drift layer structure 730 or be formed by dopant atoms being introduced in a previously grown upper section of the epitaxial layer 707. The body structure 120 can form a continuous layer or comprise a multiplicity of body wells separated laterally from one another. The lateral extent of the body well can be comparatively large compared with the width of trenches formed afterward.

Along sections of the main surface 701, heavily doped source wells 711 of the conductivity type of the drift layer 731 can be formed between the main surface 701 and the body structure 720. The sections of the main surface 701 with the source wells 711 can correspond to transistor cell regions of finalized SiC semiconductor components. A further section of the main surface 701 can separate the sections with the source wells 111 laterally from one another. The further section can comprise a kerf region and edge termination regions of the finalized semiconductor components, wherein structures for lateral field reduction can be formed in the edge termination regions.

In accordance with the exemplary embodiments depicted, the body structure 720 is p-conducting and the drift layer structure 730 is n-conducting. In accordance with other exemplary embodiments, the body structure 720 can be n-conducting and the drift layer structure 730 can be p-conducting.

A trench mask 790 having mask openings 791 is formed on the main surface 701 by means of a photolithographic method. By means of an anisotropic etching method, e.g. a chemico-physical dry etching method, the structure of the trench mask 790 is transferred into the silicon carbide substrate 700 dimensionally accurately, wherein trenches 750 are formed, which can extend below the mask openings 791 from a plane spanned by the main surface 701 through the source structures 111 and the body structures 720 into the drift layer structure 730.

Figure 3B:
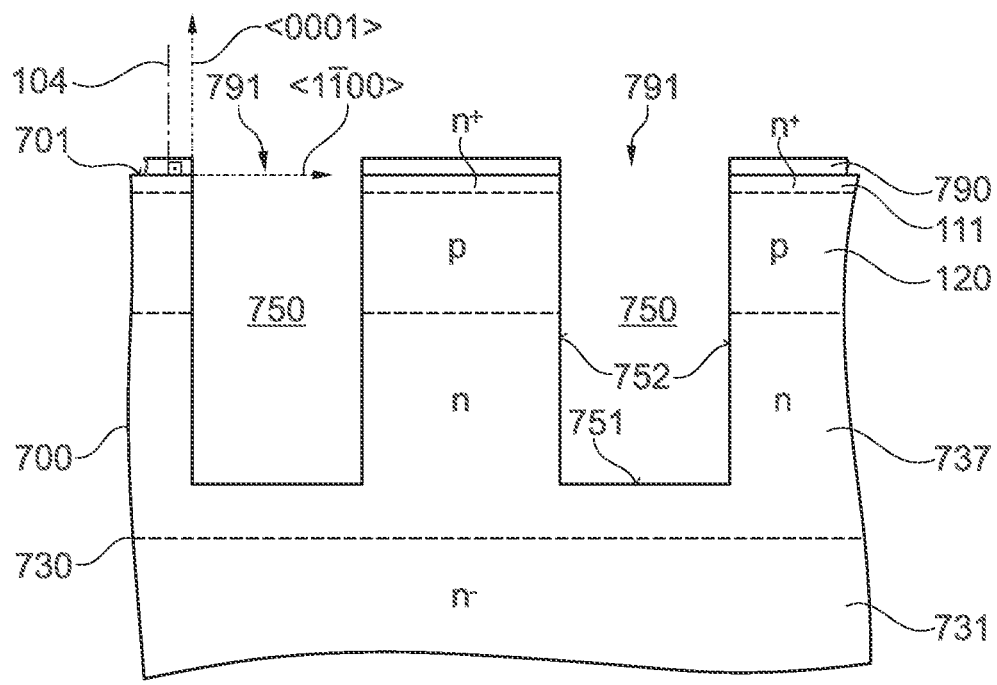

FIG. 3B shows the trench mask 790 having the mask openings 791. The trench mask 790 can comprise a single layer composed of one material or two or more partial layers composed of different materials. In accordance with one embodiment, the trench mask 790 comprises carbon, e.g. graphite, silicon, silicon oxide and/or silicon nitride.

The trenches 750 can be formed in a strip-like fashion, wherein a length of the trenches 750 in a direction orthogonal to the cross-sectional plane is greater than a trench width wg of the trenches 750 parallel to the cross-sectional plane. Adjacent trenches 750 can be formed with a center-to-center distance with respect to one another, wherein the center-to-center distance between respectively adjacent trenches 750 along the silicon carbide substrate can be identical or can vary. Sections of the body structure 720 from FIG. 3A between the trenches 750 form body regions 120. Sections of the source wells 711 from FIG. 3A between the trenches 750 form source structures 111. The trench bottom 751 can have a section parallel to the main surface 701. Sidewalls 752 of the trenches 750 can be vertically aligned and/or be aligned parallel to (1-100) lattice planes with comparatively high charge carrier mobility. Transitions between the sidewalls 752 and the trench bottom 751 can be rounded.

An implantation mask 740 is formed, which shields the sidewalls 752 from the introduction of dopant atoms and permits an implantation through at least one section of the trench bottom 751. By way of example, forming an implantation mask 740 comprises thermal oxidation and/or deposition and patterning of a mask layer.

Figure 3C:
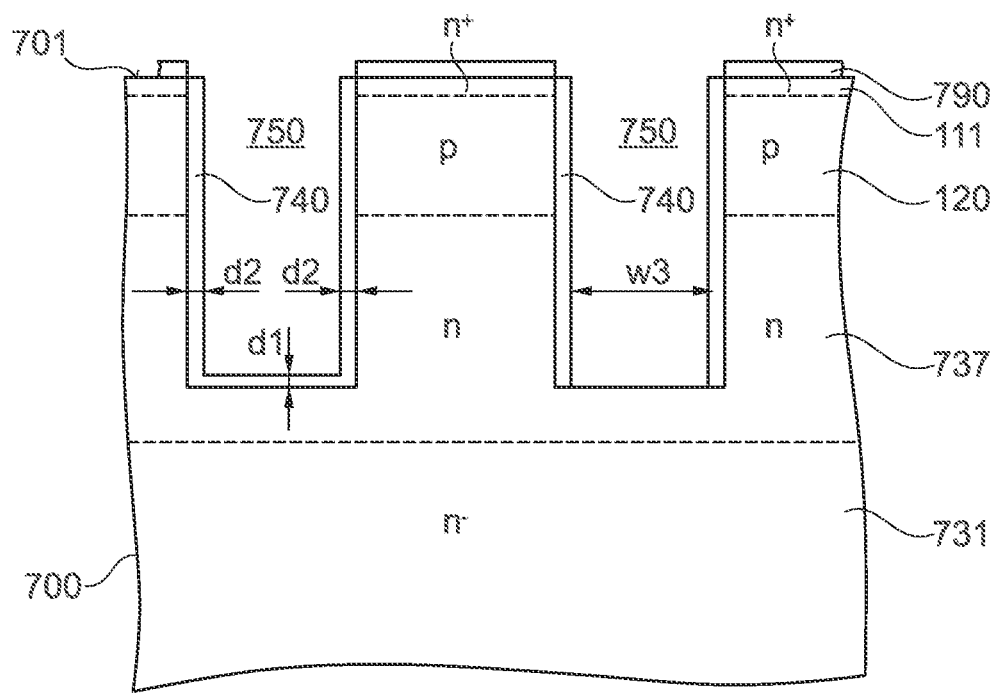

FIG. 3C shows an implantation mask 740, which covers the trench bottom 751 with a layer thickness d1 and the sidewalls 752 with a layer thickness d2, wherein the layer thickness d1 at the trench bottom can be less than the layer thickness d2 at the sidewalls. In accordance with other embodiments, an implantation mask 740 can be formed which selectively covers only the sidewalls 752 and leaves the trench bottom 751 uncovered. This can be regarded as an implantation mask 740 having a vanishing layer thickness d1 at the trench bottom 751 as is illustrated in the right-hand half of FIG. 3D. Such an implantation mask can be formed for example by isotropically etching the implantation mask 740 from FIG. 3C by removing the implantation mask 740 from FIG. 3C from above (spacer etching) or by depositing a conformal implantation mask layer with subsequent spacer etching.

With the implantation mask 740 in place, dopant atoms are introduced through the trench bottom 751. Introducing the dopant atoms can comprise a plurality of implantations at different implantation energies, wherein the opening of the implantation mask 740 at the trench bottom 751 can be altered between the different implantations.

The implantation mask 740 prevents the spreading of dopant atoms through the sidewalls 752 into the body regions 120 and into the current distribution layer 737.

The section of the trench bottom 751 through which dopant atoms are introduced has a lateral third width w3. In accordance with the exemplary embodiments in FIG. 3D, the third width w3 can correspond to the lateral distance between the two sections of the implantation mask 740 at the opposite sidewalls 752 at the trench bottom 751, wherein the two sections of the implantation mask 740 between them define a mask opening. The third width w3 of the mask opening of the implantation mask 740 and/or the width of a thinned section of the implantation mask 740 at the trench bottom 751 and also the penetration depth of the implanted dopant atoms define a lateral first width w1 of a central section of the shielding regions 140. In the central section of the shielding region 145, in a doping plane 105 extending at a distance from the trench bottom 751 parallel or approximately parallel to the trench bottom 751, a dopant concentration deviates by not more than 10%, by not more than 5% or by not more than 1% from a maximum value in the doping plane 105 in the central section 145.

Figure 3D:
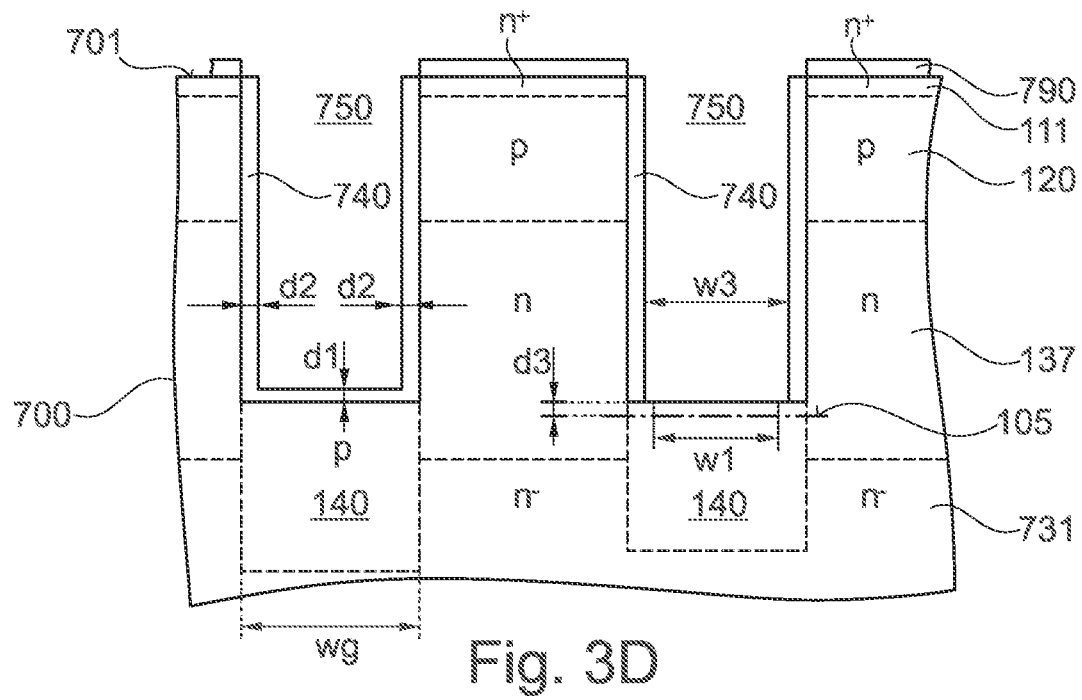

FIG. 3D shows the shielding regions 140 extending in each case from the trench bottom 751 into the silicon carbide substrate 700. Sections of the current distribution layer 737 from FIG. 3C between the trenches 750 and between the shielding regions 140 form current distribution regions 137. A central section 145 of the shielding regions 140 has a first width w1, which is less than the trench width wg. A thermal treatment that can be carried out for at least 800° C. and at most 2200° C. or at most 1900° C. can activate the dopant atoms introduced into the shielding regions 140 and anneal implant damage. During the thermal treatment, the implantation mask 740 can be in place or be replaced by a sacrificial mask composed of a thermally stable material. The implantation mask 740 is removed.

Figure 3E:
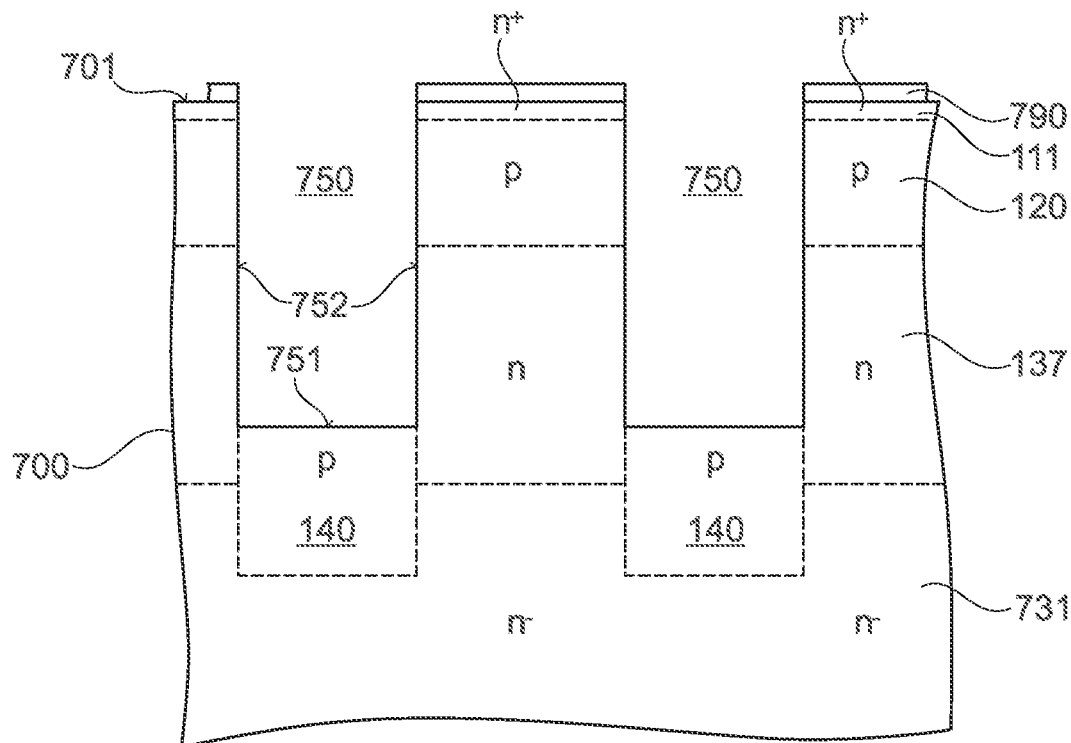

FIG. 3E shows the trenches 750 and the shielding regions 140 below the trenches 750 after the removal of the implantation mask 740 from FIG. 3D.

A field dielectric layer 259 can be formed in the trenches 750, said field dielectric layer covering the sidewalls 752 and the trench bottom 751. Forming the field dielectric layer 259 can comprise thermal oxidation and/or deposition of one or a plurality of dielectric layers.

Figure 3F:
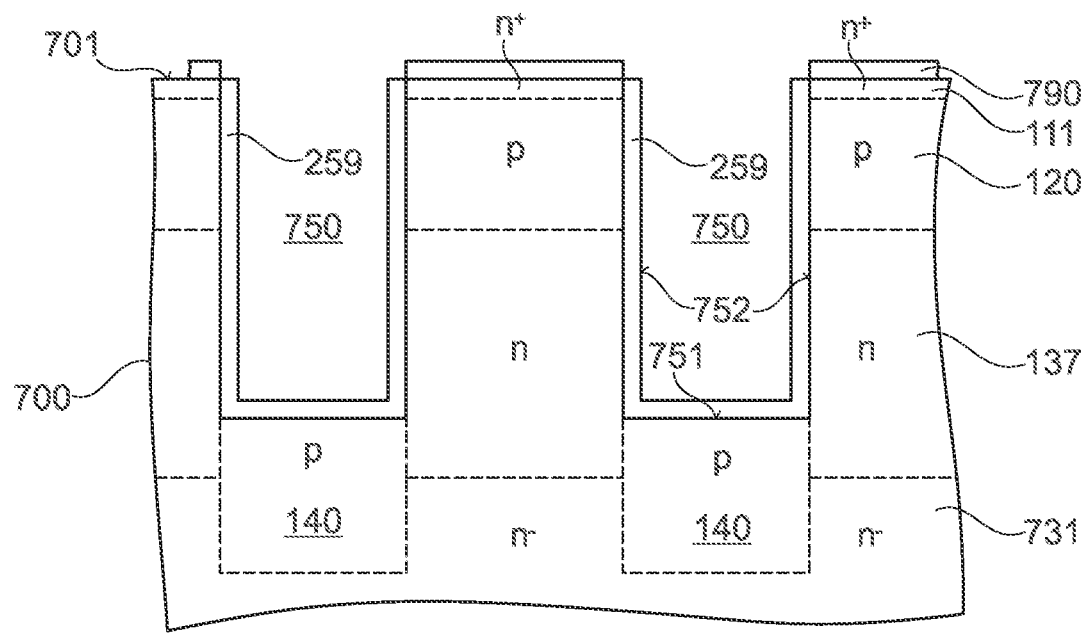

FIG. 3F shows a field dielectric layer 259 covering the sidewalls 752 and the trench bottom 751 with uniform layer thickness. According to another embodiment, the layer thickness of the field dielectric layer 259 can be smaller at the trench bottom 751 than at the sidewalls 752.

A conformal etching mask layer 260 can be formed, which covers the field dielectric layer 259. The layer thickness of the etching mask layer 260 is chosen such that the etching mask layer 260 does not completely fill the trenches 750. Forming the etching mask layer 260 can comprise depositing one or a plurality of layers.

Figure 3G:
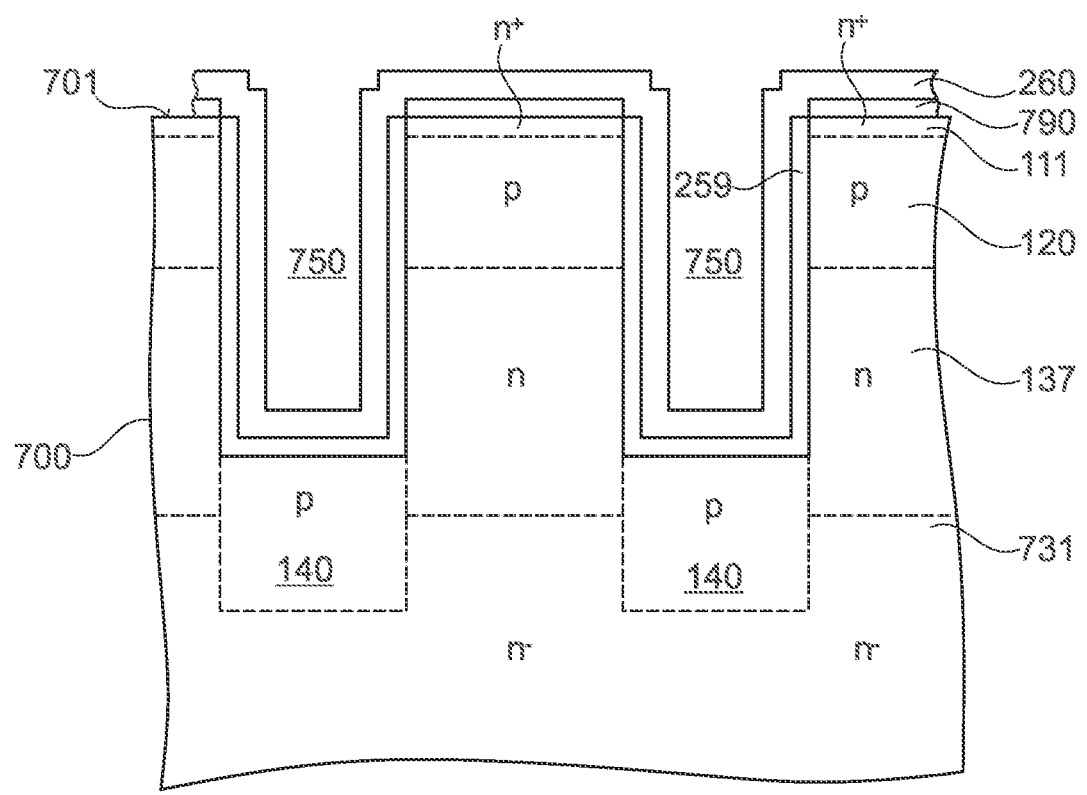

FIG. 3G shows a conformal etching mask layer 260, which covers sections of the field dielectric layer 259 in the trenches 750 and the trench mask 790 with uniform layer thickness. The layer thickness can correspond to a later bottom width of a bottom section of the field dielectric. The material of the etching mask layer can be silicon oxide, silicon nitride, carbon, polycrystalline silicon and/or amorphous silicon. The etching mask layer 260 and the field dielectric layer 259 can be formed from different materials. An anisotropic etching method, for example a chemico-physical dry etching method, can remove material of the etching mask layer 260 from above. The removal of the etching mask layer 260 is ended after uncovering a section of the field dielectric layer 259 at the trench bottom 751 and before the complete removal of the material of the etching mask layer 260.

Figure 3H:
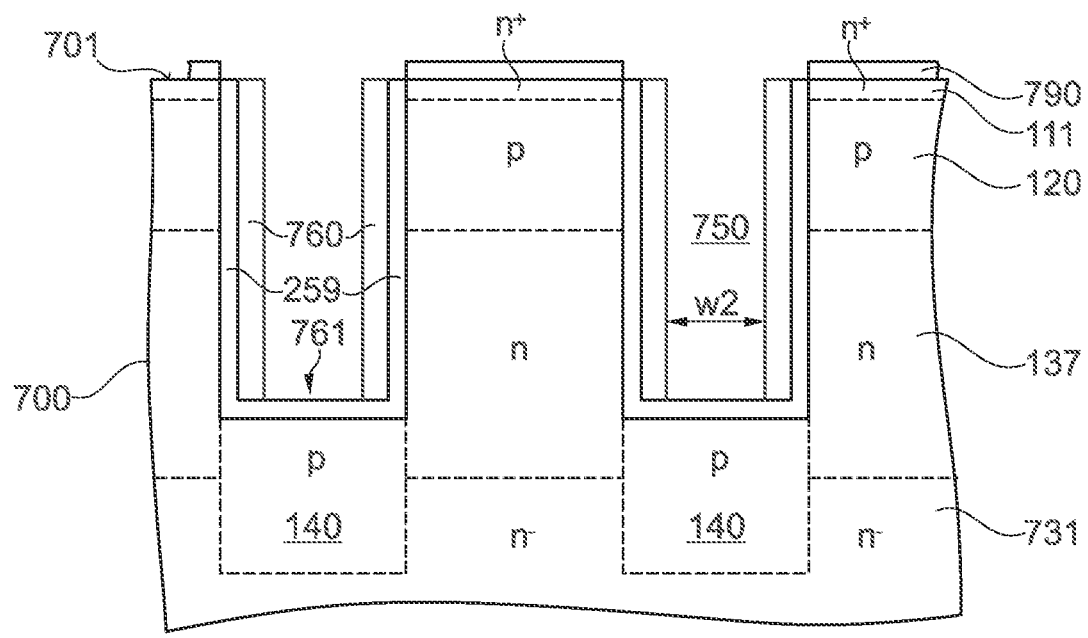

FIG. 3H shows the etching mask 760 formed from remaining sections of the etching mask layer 260 from FIG. 3G, said etching mask 760 having an etching mask opening 761 in a central section of the trench 750. A width of the etching mask opening 761 defines a second width w2.

With the etching mask 760 in place, a section of the field dielectric layer 259 that is left uncovered by the etching mask opening 761 is removed. The etching mask 760 is then removed.

Figure 3I:
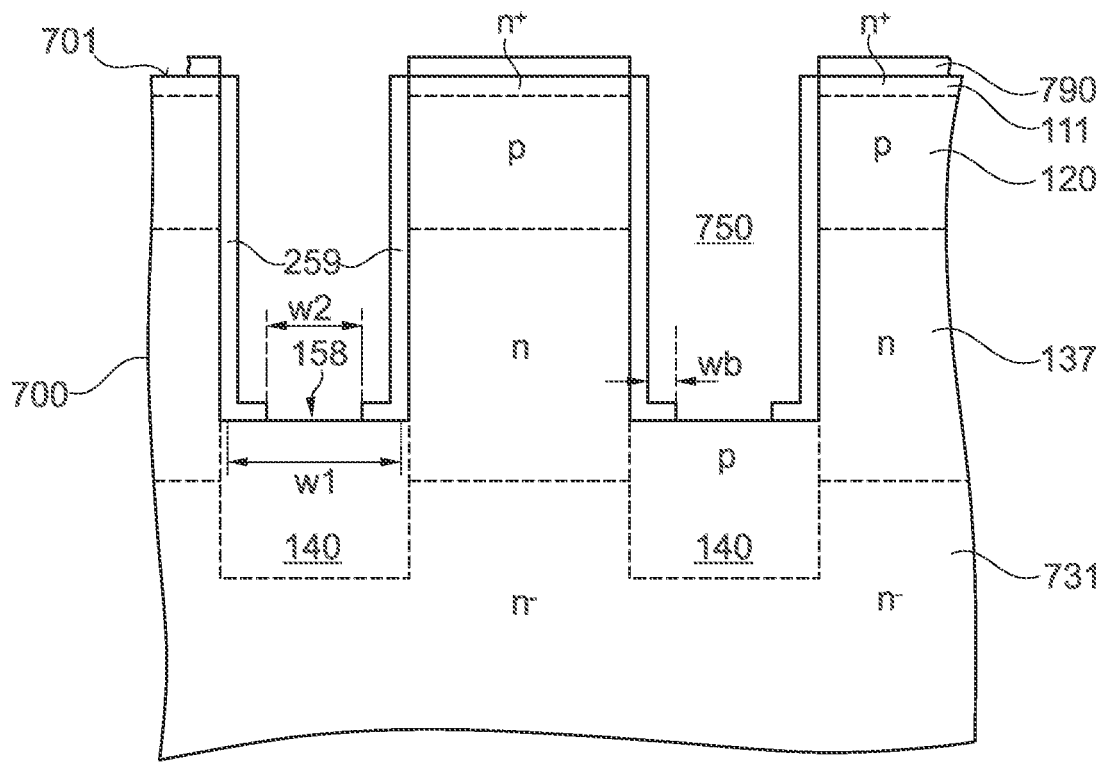

FIG. 3I shows the field dielectric layer 259 after the etching thereof with an opening 158, which leaves a central section of the trench bottom 751 uncovered. The opening 158 has the second width w2, which is less than the first width w1 of a central section 145 of the shielding region 140. Highly doped polycrystalline silicon and/or one or a plurality of metallic layers are deposited, wherein the trenches 750 are filled.

Figure 3J:
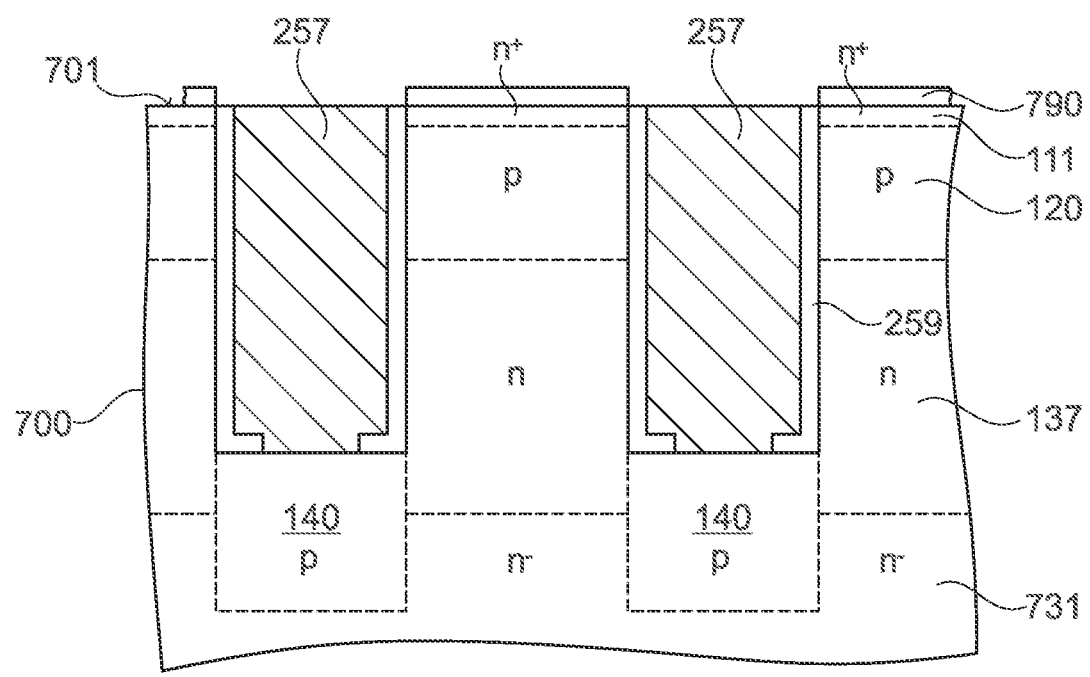

FIG. 3J shows a first doped semiconductor material 257 filling the trenches 750. The first doped semiconductor material 257 is caused to recede in the trenches 750 to below a lower edge of the body regions 120. The first semiconductor material 257 that has been caused to recede forms a conductive connection structure 157. An isolation dielectric 156 is formed on the connection structure 157. Forming the isolation dielectric 156 can comprise thermal oxidation of an upper part of the connection structure 157 and/or the deposition of one or a plurality of dielectric layers.

In the upper section of the trench 750, after the first doped semiconductor material 257 has been caused to recede, an upper section of the field dielectric layer 259 is removed and a gate dielectric 151 is formed. Forming the gate dielectric 151 can comprise thermal oxidation and/or the deposition of one or a plurality of dielectric layers.

Figure 3K:
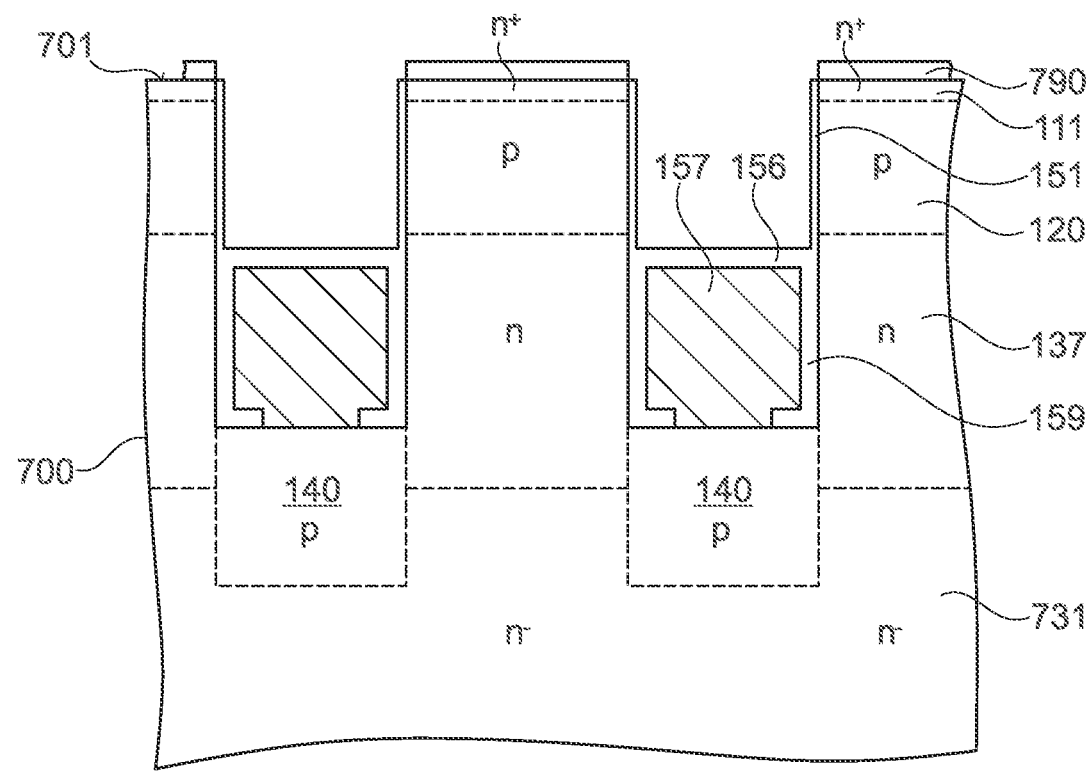

FIG. 3K shows a conductive connection structure 157 in the lower section of the trenches 750. A section of the field dielectric layer 259 from FIG. 3J in the lower section of the trench 750 forms a field dielectric 159. The conductive connection structure 157 directly adjoins the shielding region 140. The shielding region 140 and the connection structure 157 form an ohmic contact. The connection structure 157 can comprise a metal structure, for example a silicide at the interface with the shielding region 140. An isolation dielectric 156 covers the connection structure 157.

A second doped semiconductor material is deposited. Sections of the second doped semiconductor material outside the trenches 750 are removed.

Figure 3L:
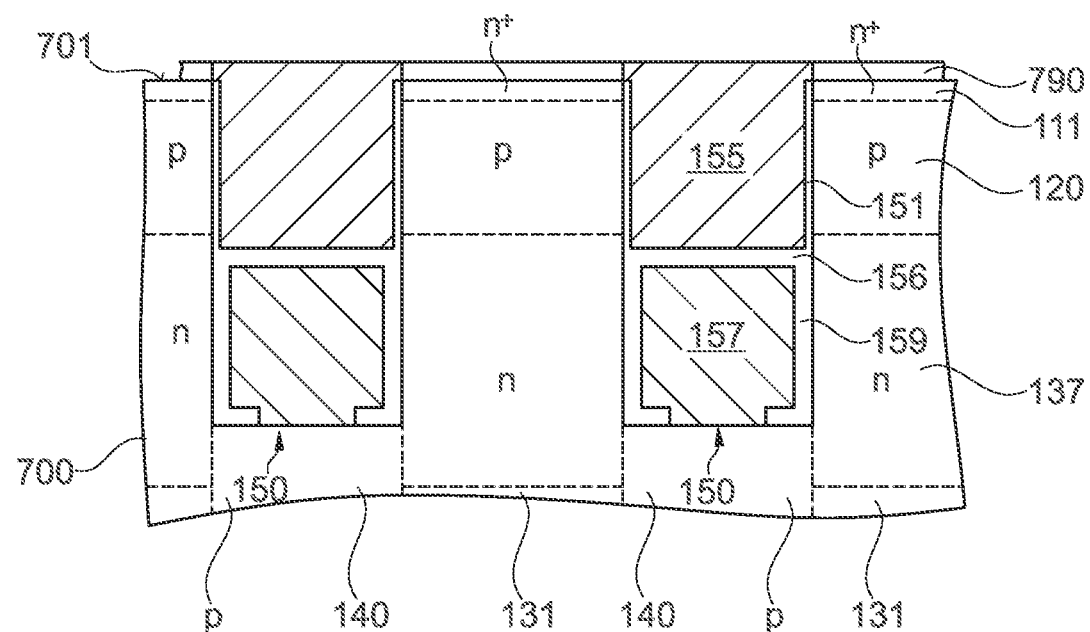

FIG. 3L shows a gate electrode 155 formed by the second deposited doped semiconductor material in the upper sections of the trenches 750.

Figure 4A:
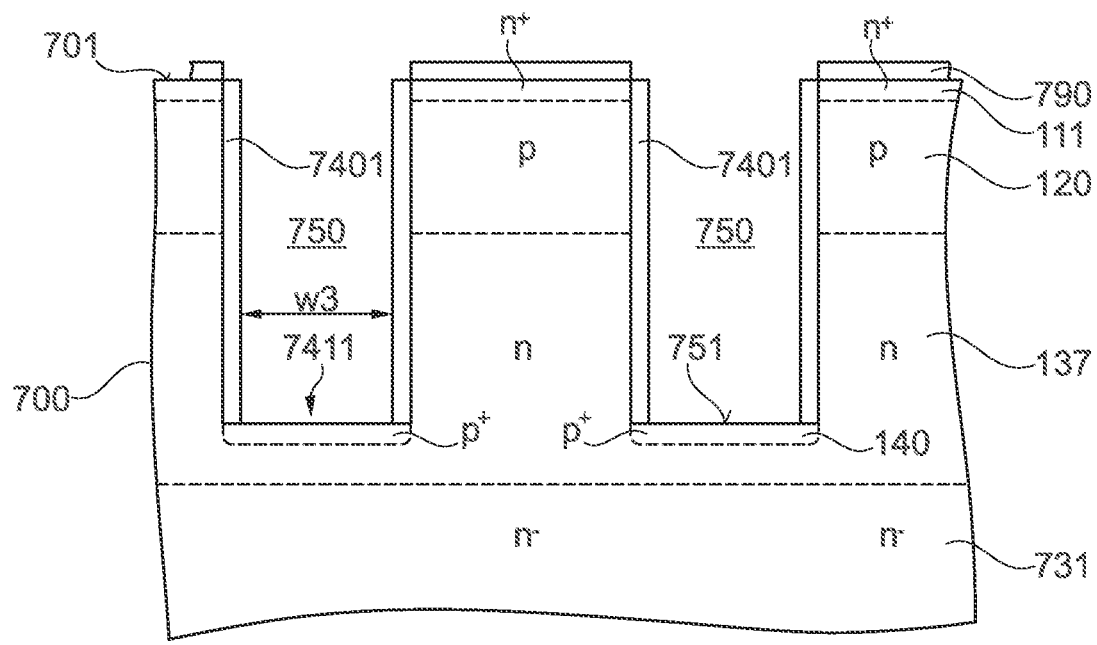
FIGS. 4A-4B show schematic vertical cross-sectional views of a silicon carbide substrate for illustrating a method in accordance with one embodiment in which dopant atoms for forming shielding regions and JFET partial regions are introduced into gate trenches by means of implantation masks.
Figure 4B:
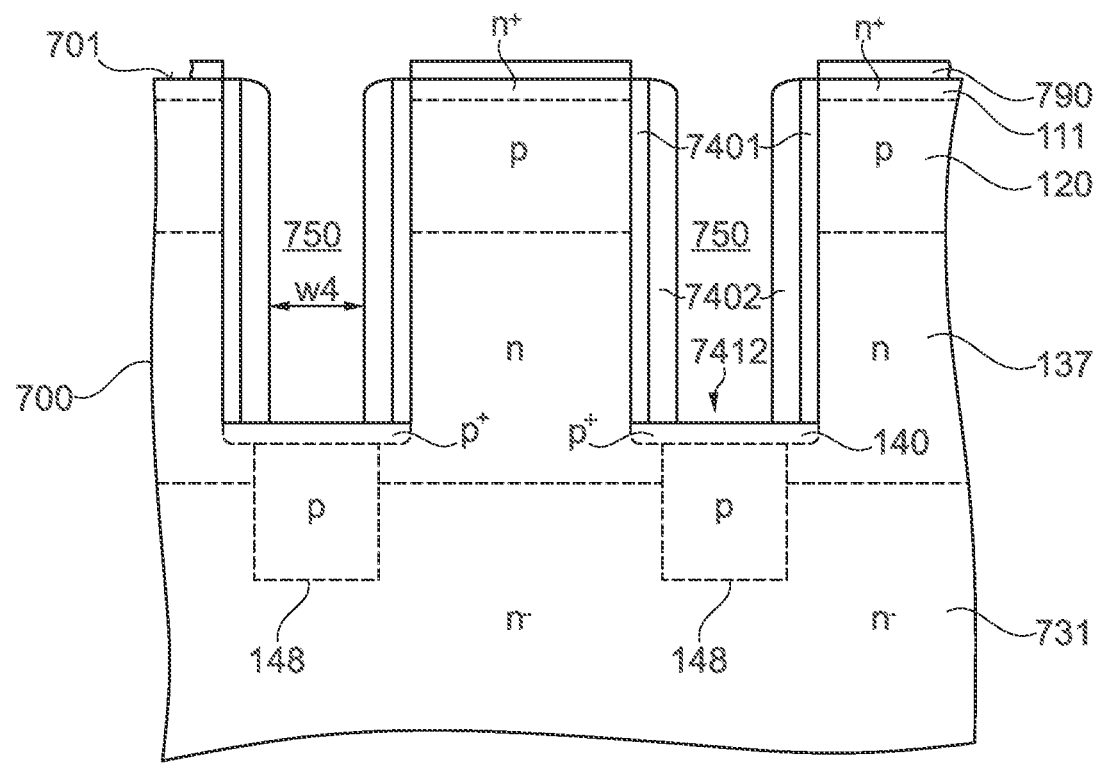

FIGS. 4A-4B relate to embodiments which provide a plurality of implantations through the trench bottom 751, wherein the implantations utilize implantation masks having implantation mask openings of different sizes.

In the trenches 750 in accordance with FIG. 3B, a first implantation mask 7401 having a first implantation mask opening 7411 having a third width w3 at the trench bottom 751 is formed, for example by means of a spacer etching of a conformal mask layer. Dopant atoms for shielding regions 140 are introduced through the first implantation mask opening 7411.

FIG. 4A shows the shielding regions 140 below the trenches 750. In the trenches 750, a second implantation mask 7402 having a second implantation mask opening 7412 having a fourth width w4 at the trench bottom 751 is formed, wherein the fourth width w4 is less than the third width w3. Forming the second implantation mask 7402 can comprise for example a spacer etching of a further conformal mask layer, wherein the second mask layer can be formed above the first implantation mask 7401 or wherein the first implantation mask 7401 can have been removed beforehand. Dopant atoms for forming JFET partial regions 148 can be introduced through the second implantation mask opening 7412.

FIG. 4B shows the JFET partial regions 148, which can in each case form a unipolar junction with the shielding regions 140 and extend further into the drift zone layer 731 proceeding from the shielding regions 140. In accordance with other embodiments, it is possible firstly to introduce the dopant atoms for the JFET partial regions 148 and later to introduce the dopant atoms for the shielding regions 140.

A narrower implantation mask opening for implantations having a high acceleration energy and penetration depth makes it possible to form JFET partial regions 148 having a comparatively large vertical extent, which do not reduce the lateral cross-sectional area of the current distribution regions 137 by lateral spreading. Even at high acceleration energies, the relatively thick second implantation mask 7402 prevents dopant atoms from spreading through the sidewalls of the trench 750 into the body regions 120 and into the current distribution regions 137.

A wider implantation mask opening for implantations having a low acceleration energy and a small penetration depth makes it possible to form an effective shielding region 140 for critical partial regions of the field dielectric 159 at the bottom 152 of the gate electrode structure 150.

FIGS. 5A-5B and 6-8 show semiconductor components 500 which can have arisen for example from a method described with reference to FIGS. 1, 2A-2B, 3A-3L and 4A-4B.

Figure 5A:
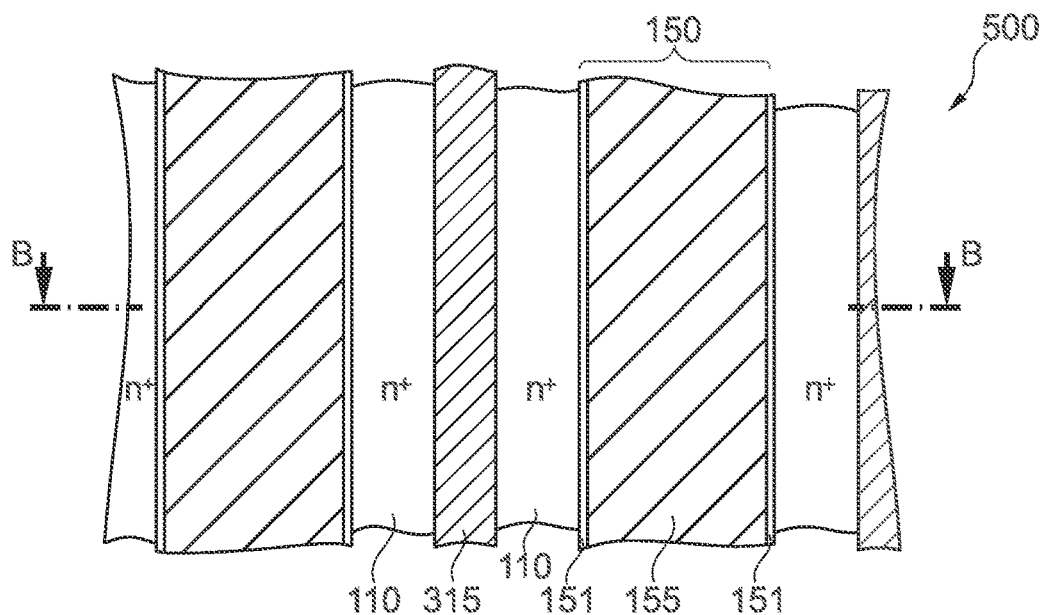
FIGS. 5A-5B show a horizontal and a vertical cross section through a SiC semiconductor component in accordance with a further embodiment.
Figure 5B:
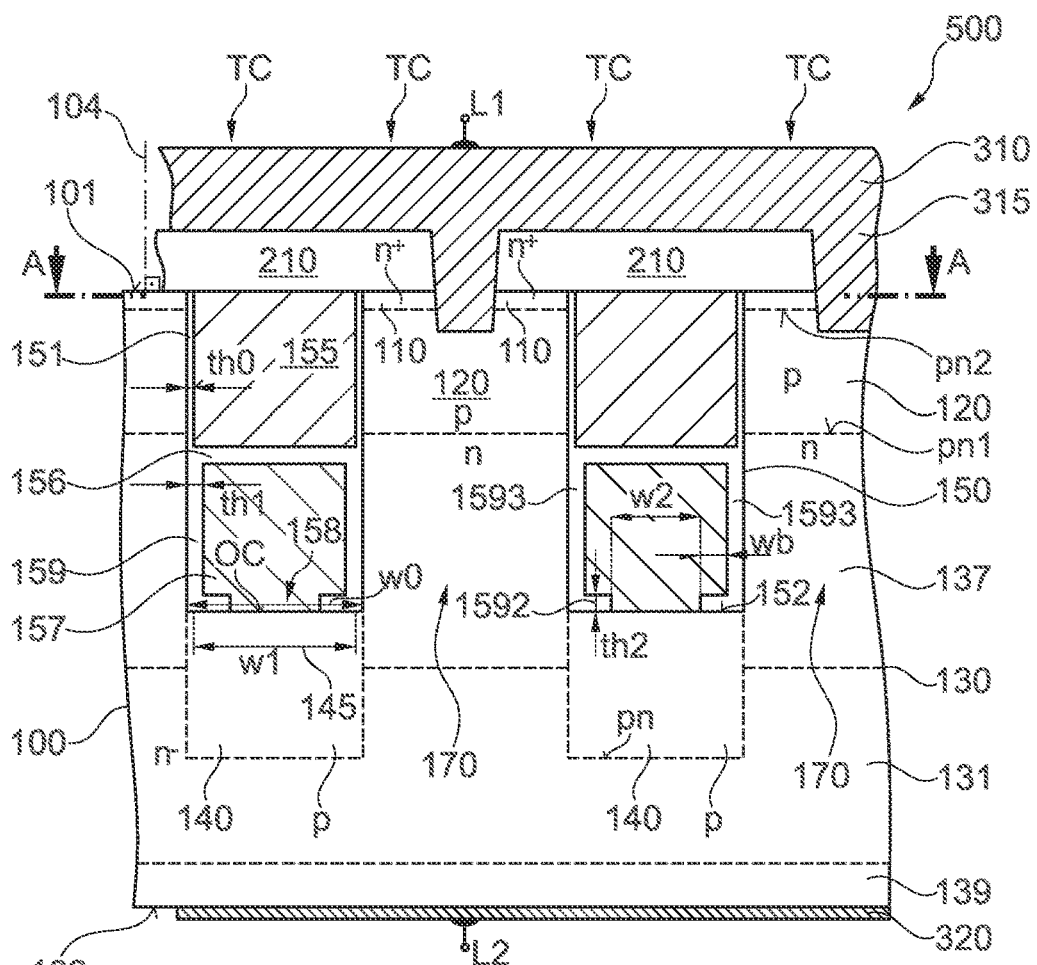

In FIGS. 5A-5B, a semiconductor component 500 comprises a SiC semiconductor body 100. In accordance with other embodiments, a semiconductor body comprising a different semiconductor material having a wide band gap can be provided. The semiconductor component 500 can be an IGFET, an IGBT or an MCD (MOS controlled diode). The semiconductor material can be e.g. crystalline silicon carbide having a hexagonal crystal lattice, for example 2H—SiC, 6H—SiC or 4H—SiC.

A first surface 101 on a front side of the SiC semiconductor body 100 can be coplanar with a principal lattice plane of the SiC crystal, wherein the first surface 101 is planar. According to another embodiment, the orientation of the first surface 101 is inclined by an offset angle α relative to a principal lattice plane, wherein an absolute value of the offset angle can be at least 2° and at most 8°, for example approximately 4°. The first surface 101 can then be planar or ribbed. In the case of a ribbed first surface 101, the first surface 101 can have parallel first surface sections and parallel second surface sections. The first surface sections are offset relative to one another and inclined by the offset angle α relative to a horizontal center plane. The second surface sections extend obliquely with respect to the first surface sections and connect the first surface sections, such that a cross-sectional line of the first surface forms a sawtooth line.

Directions parallel to the planar first surface 101 or to a center plane of a ribbed first surface 101 are horizontal and lateral directions. A normal 104 to a planar first surface 101 or to the center plane of a ribbed first surface 101 defines a vertical direction. The <0001> lattice direction is inclined by the offset angle α in a plane orthogonal to the cross-sectional plane in FIG. 5B. The <1-100> lattice direction runs in the cross-sectional plane and parallel to the first surface 101.

On the rear side of the SiC semiconductor body 100, a second surface 102 extends parallel to the first surface 101. A total thickness of the SiC semiconductor body 100 between the first and second surfaces 101, 102 can be in the range of from hundreds of nm to hundreds of μm.

On the front side, transistor cells TC are formed along the first surface 101. A drift structure 130 is formed between the transistor cells TC and the second surface 102. The drift structure 130 can comprise a heavily doped base section 139 and a weakly doped drift zone 131. The base section 139 directly adjoins the second surface 102. The drift zone 131 is formed between the transistor cells TC and the base section 139. Along the second surface 102, the dopant concentration in the base section 139 is high enough to form an ohmic contact with a metal.

If the semiconductor component 500 is an IGFET or an MCD, base section 139 and drift zone 131 have the same conductivity type. If the semiconductor component 500 is a reverse blocking IGBT, base section 139 and drift zone 131 have complementary conductivity types. If the semiconductor component 500 is a reverse conducting IGBT, the base section 139 can comprise zones of both conductivity types extending in each case from the drift zone 131 to the second surface 102.

The drift zone 131 can be formed in an epitaxial layer. An average dopant concentration in the drift zone 131 can be in a range of from $1E15$ $cm^{-3}$ to $5E16$ $cm^{-3}$. The drift structure 130 can comprise further doped regions, for example field stop zones, barrier zones of the conductivity type of the drift zone 131 and/or oppositely doped regions.

In the exemplary embodiment depicted, the drift structure 130 has current distribution regions 137, which can directly adjoin the drift zone 131 and be formed between the drift zone 131 and the first surface 101. An average dopant concentration in the current distribution regions 137 is at least 150% of an average dopant concentration in the drift zone 131 or is for example at least double the magnitude of that in the drift zone 131. However, the drift structure 130 can also be free of current distribution regions 137. In this case, it is possible for the drift zone 131 to directly adjoin the body regions 120.

The drift zone 131 can directly adjoin the base section 139 or a buffer layer, wherein the buffer layer and the drift zone 131 form a unipolar junction. A vertical extent of the buffer layer can be approximately 1 μm. An average dopant concentration in the buffer layer can be in a range of from $3E17$ $cm^{-3}$ to $1E18$ $cm^{-3}$. The buffer layer can reduce mechanical stresses in the semiconductor body 100, can contribute to reducing the defect density in the semiconductor body 100 and/or can contribute to forming a desired electric field profile in the drift structure 130.

The transistor cells TC are formed along gate electrode structures 150 extending from the first surface 101 into the SiC semiconductor body 100 and into the drift structure 130. Sections of the SiC semiconductor body 100 between adjacent gate electrode structures 150 form semiconductor mesas 170.

A longitudinal extent of the gate electrode structures 150 along a first horizontal direction perpendicular to the cross-sectional plane in FIG. 5B is greater than a width of the gate electrode structures 150 along a second horizontal direction in the cross-sectional plane in FIG. 5B. The gate electrode structures 150 can be formed for example as long strips extending from one side of a transistor cell region to the opposite side, wherein the length of the gate electrode structures 150 can be up to hundreds of μm or a plurality of mm.

The gate electrode structures 150 can be formed in each case at identical distances from one another, wherein a center-to-center distance between adjacent gate electrode structures 150 can be in a range of from 1 μm to 10 μm, for example of from 2 μm to 5 μm. A vertical extent of the gate electrode structures 150 can be in a range of from 300 nm to 5 μm, for example in a range of from 500 nm to 2 μm.

In the exemplary embodiment depicted, the sidewalls at the longitudinal sides of the gate electrode structures 150 are aligned vertically with respect to the first surface 101. In accordance with other embodiments with a different orientation of the longitudinal axis of the gate electrode structures 150 with respect to the lattice axes, the sidewalls can be inclined with respect to the vertical such that an angle between one of the sidewalls and the normal 104 is equal to the offset angle α or deviates therefrom by not more than ±1° (cf. e.g. FIG. 7), wherein at least one longitudinal sidewall of the gate electrode structures 150 lies in a principal lattice plane with high charge carrier mobility. Generally, at least one longitudinal sidewall of the gate electrode structures 150 can lie in one of the lattice planes (11-20), (-1-120), (1-100) and/or (-1100).

In a semiconductor mesa 170, source regions 110 can be formed along the sidewalls of the adjacent gate electrode structures 150, said source regions extending from the first surface 101 into the semiconductor body 100. A body region 120 is formed in each semiconductor mesa 170, said body region separating the source regions 110 from a current distribution region 137 formed at least partly in the semiconductor mesa 170. The body region 120 can adjoin in each case both adjacent gate electrode structures 150.

The body regions 120 and the current distribution regions 137 form first pn junctions pn1. The body regions 120 and the source regions 110 form second pn junctions pn2.

The gate electrode structures 150 comprise a conductive gate electrode 155. The gate electrode 155 can comprise for example heavily doped polycrystalline silicon and/or a metal-containing layer. The gate electrode 155 can be connected to a gate metallization, wherein the gate metallization can form a gate terminal or can be connected to a gate terminal.

A gate dielectric 151 isolates the gate electrode 155 from the body regions 120. The gate dielectric 151 can comprise or consist of a semiconductor dielectric. The semiconductor dielectric can be for example thermally grown or deposited semiconductor oxide, for example a silicon oxide, a semiconductor nitride, for example deposited or thermally formed silicon nitride, and/or a semiconductor oxynitride, for example a silicon oxynitride. The gate dielectric 151 can also comprise some other deposited dielectric material or an arbitrary combination of the materials mentioned.

In accordance with one embodiment, the gate dielectric 151 comprises a silicon oxide that is densified and/or partly nitrided after deposition. Materials and thickness th0 of the gate dielectric 151 can be chosen such that a voltage in a range of from 1 to 8 V is established as threshold voltage for the transistor cells TC.

An interlayer dielectric 210 can isolate the gate electrode 155 from a first load electrode 310. Contact structures 315 can extend from the first load electrode 310 through openings in the interlayer dielectric 210 as far as or right into the SiC semiconductor body 100. The contact structures 315 form a low-resistance electrical connection between the source regions 110, the body regions 120 and the first load electrode 310 on the front side of the component. The base section 139 and a second load electrode 320 on the rear side of the SiC semiconductor body 100 form an ohmic contact along the second surface 102 on the rear side of the component.

The gate electrode structures 150 furthermore comprise a conductive connection structure 157. The conductive connection structure 157 can comprise for example heavily doped polycrystalline silicon and/or a metal-containing layer, e.g. a silicide. The connection structure 157 is connected to a potential or network node, the electrical potential of which during operation of the component is different than the potential of the gate terminal and the potential at the second load terminal L2. By way of example, the connection structure 157 is connected to the first load terminal L1, to an auxiliary terminal of the semiconductor component 500 or to an internal network node.

An isolation dielectric 156 isolates gate electrode 155 and connection structure 157. The isolation dielectric 156 can comprise deposited silicon oxide, thermally formed silicon oxide, silicon nitride, silicon oxynitride and/or some other deposited dielectric material.

A field dielectric 159 isolates the connection structure 157 from the drift structure 130 in a lateral direction. The field dielectric 159 can comprise deposited silicon oxide, thermally formed silicon oxide, silicon nitride, silicon oxynitride and/or other deposited dielectric material.

The field dielectric 159 can have a sidewall section 1593, which is formed along a sidewall of the gate electrode structure 150 and separates the connection structure 157 from the current distribution regions 137. A first layer thickness th1 of the sidewall section 1593 can be greater than a thickness th0 of the gate dielectrics 151. By way of example, the first layer thickness th1 of the sidewall section 1593 of the field dielectric 159 is at least 120%, for example at least 150%, of the thickness th0 of the gate dielectric 151.

The field dielectric 159 can have a bottom section 1592 having a second layer thickness th2, wherein the second layer thickness th2 can be equal to the first layer thickness th1 or less than the first layer thickness th1. The bottom section 1592 can be formed in an outer section of the bottom 152 between the connection structure 157 and the shielding region 140 and have a central opening 158.

The bottom section 1592 and the sidewall section 1593 can be directly connected to one another. By way of example, the bottom section 1592 and the sidewall section 1593 are formed integrally with one another, that is to say are fabricated in one piece. By way of example, the bottom section 1592 and the sidewall section 1593 consist of the same material or the same materials. The bottom section 1592 can have a bottom width wb.

Shielding regions 140 can be formed along the bottom of the gate electrode structures 150, said shielding regions directly adjoining the gate electrode structures 150. The shielding regions 140 form pn junctions pn with the drift structure 130, for example with the drift zone 131. An average dopant concentration in the shielding regions 140 can be in a range of from $1E17$ $cm^{-3}$ to $2E19$ $cm^{-3}$, for example in a range of from $8E17$ $cm^{-3}$ to $8E18$ $cm^{-3}$.

The shielding region 140 has a central section 145 having a first width w1 along the bottom 152 of the gate electrode structure 150. In the central section 145, the dopant concentration in the shielding region 140 in a dopant plane parallel or approximately parallel to the bottom 152 deviates by not more than 10%, e.g. by not more than 5% or by not more than 1%, from a maximum value of the dopant concentration in the dopant plane. The central section 145 can be formed symmetrically with respect to a center axis of the gate electrode structure 150. Outside the central section 145, the dopant concentration in the shielding region 140 falls steeply in a lateral direction. The first width w1 is less than a structure width w0 of the gate electrode structure 150, wherein the structure width w0 corresponds to the lateral extent of the bottom 152. The shielding region 140 can lie completely within a vertical projection of the gate electrode structures 150, such that the lateral cross-sectional area of the current distribution regions 137 is not reduced by the shielding region 140.

In a contact region OC having a second width w2, the connection structure 157 of a gate electrode structure 150 and the shielding region 140 adjoining the gate electrode structure 150 form an ohmic contact. The second width w2 can be less than the difference between the structure width w0 and double the first layer thickness th1 of the sidewall section 1593 of the field dielectric 159. The central section 145 of the shielding region 140 thus completely covers both the contact region OC and those sections of the field dielectric 159 which are directly adjacent to the contact region OC and reduces the maximum electrical field strength in the bottom section 1592 of the field dielectric 159.

The contact region OC can be laterally delimited by the bottom sections 1592. The bottom sections 1592 can directly adjoin the central section 145 of the shielding regions 140. By way of example, the bottom sections 1592 cover regions of the central section 145 of the shielding region 140 in the vertical direction and/or laterally overlap the central section 145 of the shielding region 140.

The contact region OC in particular does not extend as far as the transitions between the side walls and the bottom. The contact region OC is withdrawn on account of the reduced opening at the bottom, through which opening the connection structure 157 contacts the shielding region 140.

The first load electrode 310 can form a first load terminal L1 or can be electrically connected to a first load terminal L1. The first load terminal L1 can be the anode terminal of an MCD, the source terminal of an IGFET or the emitter terminal of an IGBT. The second load electrode 320 can form a second load terminal L2 or can be electrically connected to a second load terminal L2. The second load terminal L2 can form the cathode terminal of an MCD, the drain terminal of an IGFET or the collector terminal of an IGBT.

In the case of an avalanche breakdown, the conductive connection structure 157 carries away charge carriers, for example holes from an n-doped drift zone 131, which pass the pn junction pn between shielding region 140 and drift structure 130 to the first load electrode 310 with high effectiveness. The avalanche current is conducted past the body regions 120 and cannot contribute to turning on a parasitic bipolar transistor that can be formed from the source regions 110, the body regions 120 and the drift structure 130.

Figure 6:
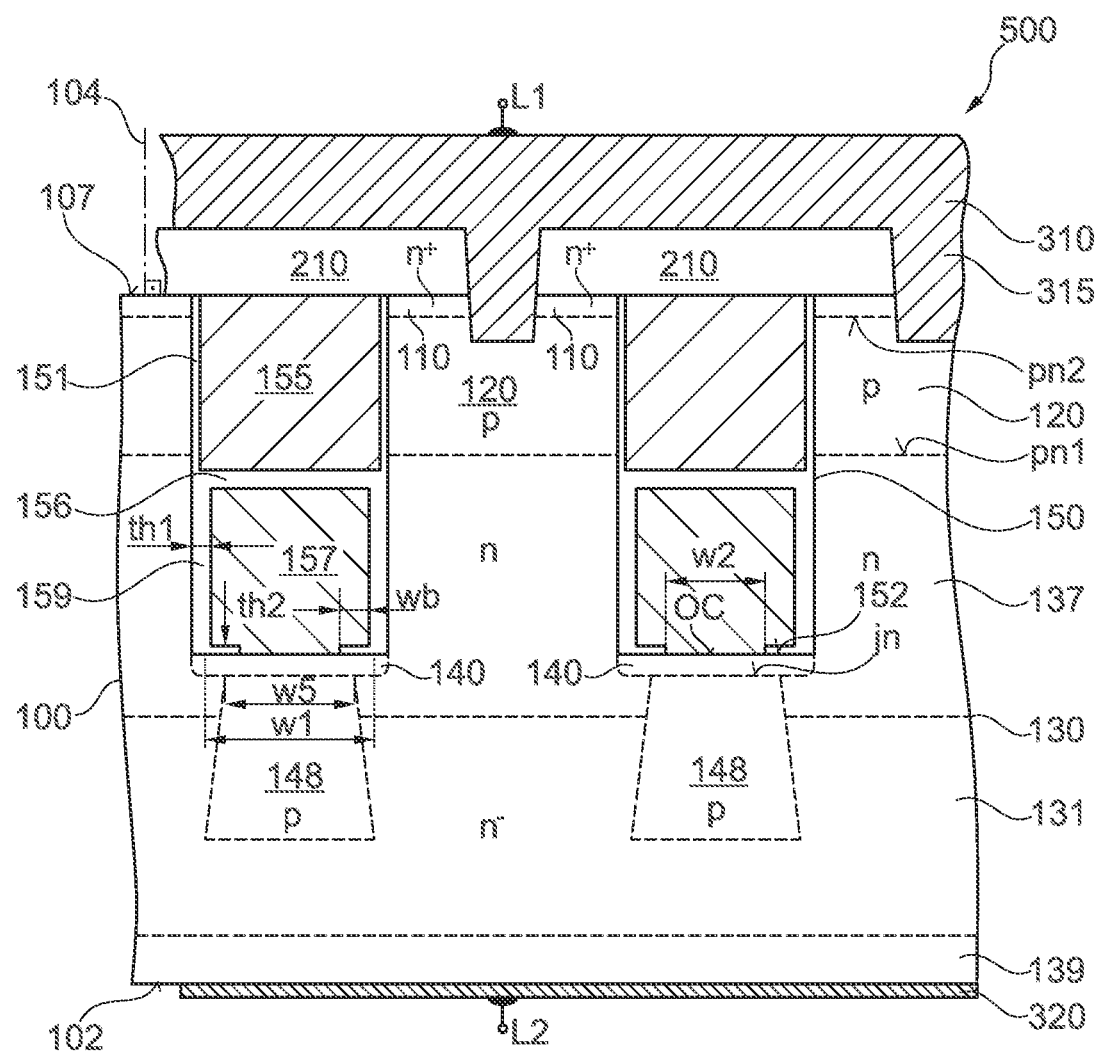
FIGS. 6-8 each show a vertical cross section through a SiC semiconductor component in accordance with further exemplary embodiments.

In the semiconductor component 500 in FIG. 6, the second layer thickness th2 of the bottom section 1592 of the field dielectric 159 is less than the first layer thickness th1 of the sidewall section 1593. By way of example, the second layer thickness th2 is approximately one third of the first layer thickness th1. The shielding regions 140 form unipolar junctions jn with JFET partial regions 148 extending from the shielding regions 140 into the drift structure 130. A lateral width w5 of the JFET partial regions 148 along the unipolar junction jn can be less than the first width w1.

The dopant atoms for the JFET partial regions 148 and the dopant atoms for the shielding regions 140 can be introduced by way of implantations that utilize implantation mask openings of different widths. A narrower implantation mask opening for implantations with a high acceleration energy and penetration depth makes it possible to form JFET partial regions 148 having a comparatively large vertical extent, which do not reduce the lateral cross-sectional area of the current distribution regions 137. A wider implantation mask opening for implantations with a low acceleration energy and a small penetration depth makes it possible to form an effective shielding region 140 for critical partial regions of the field dielectric 159 at the bottom 152 of the gate electrode structure 150.

Figure 7:
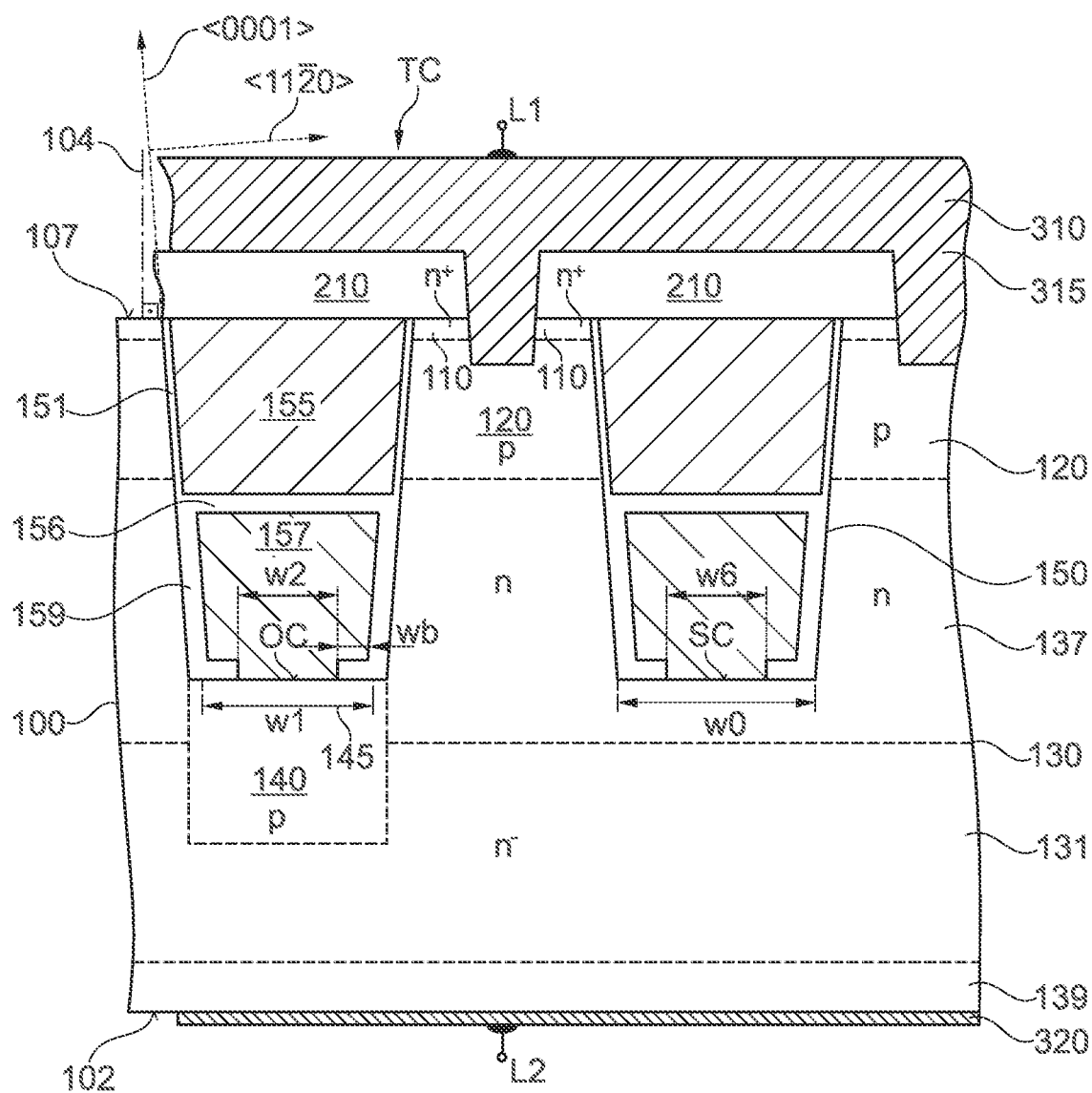

FIG. 7 shows an embodiment in which a respective sidewall of the gate electrode structures 150 lies in an (11-20) lattice plane. The gate electrode structures 150 extend along the <1-100> lattice direction running orthogonally to the cross-sectional plane and parallel to the first surface 101. The sidewall of the gate electrode structures 150 can be formed obliquely, that is to say that an angle between one of the sidewalls and the surface normal 104 to the first surface 101 is not equal to zero.

The shielding regions 140 can be formed along an entire longitudinal extent of a gate electrode structure 150 or only in sections. Alternatively or additionally, provision can be made of complete gate electrode structures 150 without a shielding region 140. In the absence of a shielding region 140, the connection structure 157 and the drift structure 130, for example the connection structure 157 and sections of the current distribution regions 137, can form Schottky contacts in Schottky contact regions SC. A lateral extent w6 of the Schottky contact regions SC can correspond to the second width w2 of the contact regions OC or can be chosen independently of the second width w2.

The Schottky contacts have a lower threshold voltage than a body diode comprising the first pn junctions pn1. In the reverse-biased state of the semiconductor component 500, a unipolar charge carrier current flows via the Schottky contacts and the connection structure 157 to the first load electrode 310. During operation of the semiconductor component 500 in the SOA, it is possible to avoid a bipolar current through the drift structure 130 and to prevent e.g. a degradation of the SiC crystal that is fostered by a bipolar current. At the same time there is a decrease in the voltage drop in the case of a current flow in the reverse-biased state of the semiconductor component 500, at least in the case of current values that are not excessively high. In the case of high current values, however, the pn junction likewise begins to conduct and reduces a further voltage rise on account of the bipolar injection.

Figure 8:
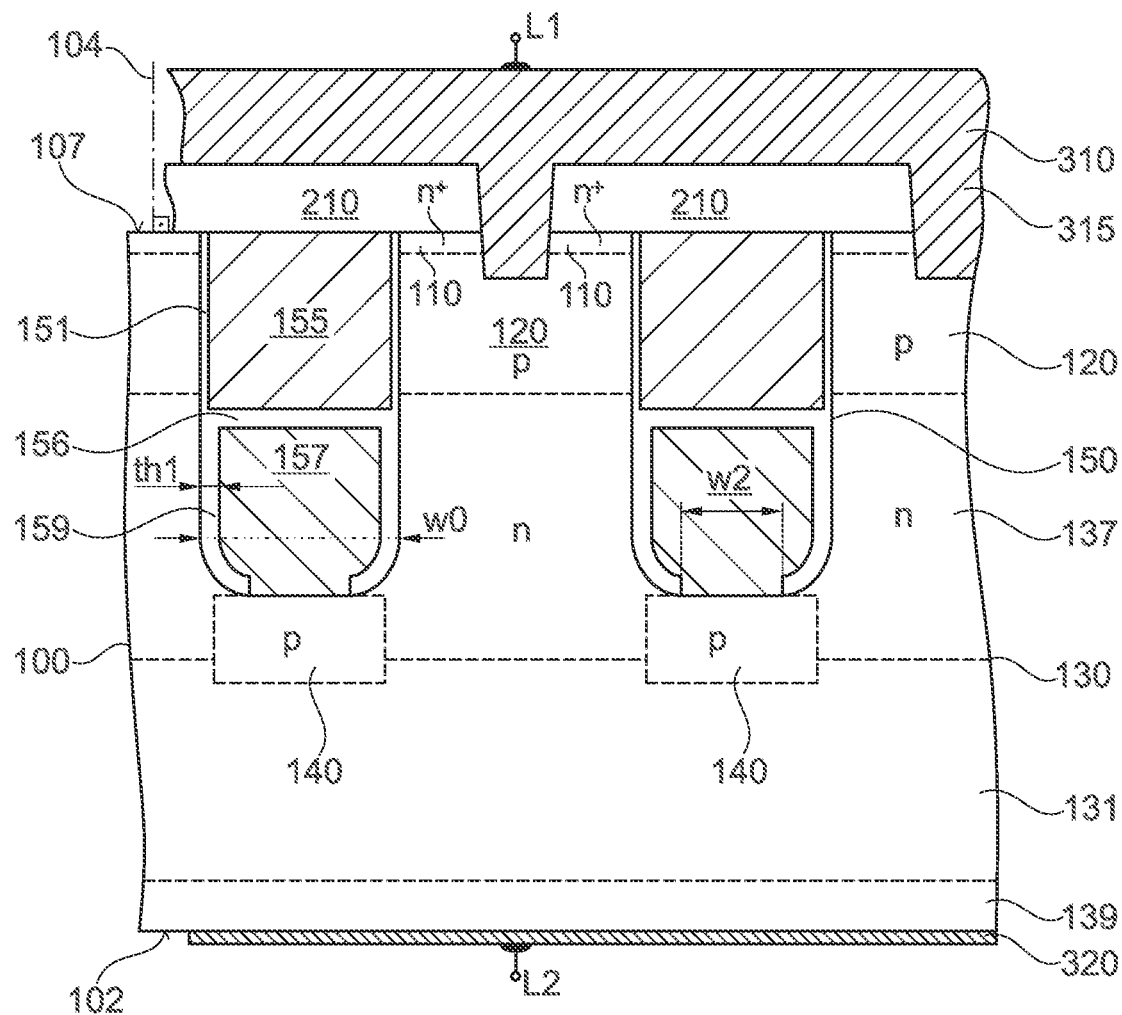

FIG. 8 shows gate electrode structures 150 having rounded transitions between the sidewalls and the bottom 152. The structure width w0 at the bottom 152 is measured in a plane in which the curvature begins proceeding from the first surface 101.

Figure 9A:
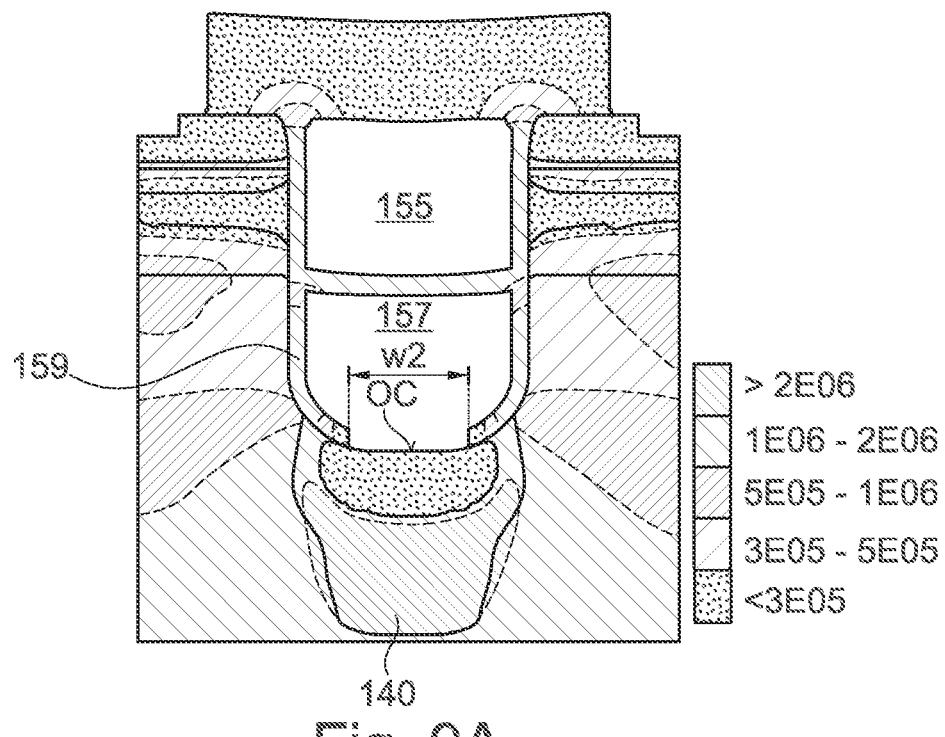
FIGS. 9A-9B illustrate respective vertical cross sections showing the electric field in a SiC semiconductor component in accordance with one exemplary embodiment and in a comparative component.
Figure 9B:
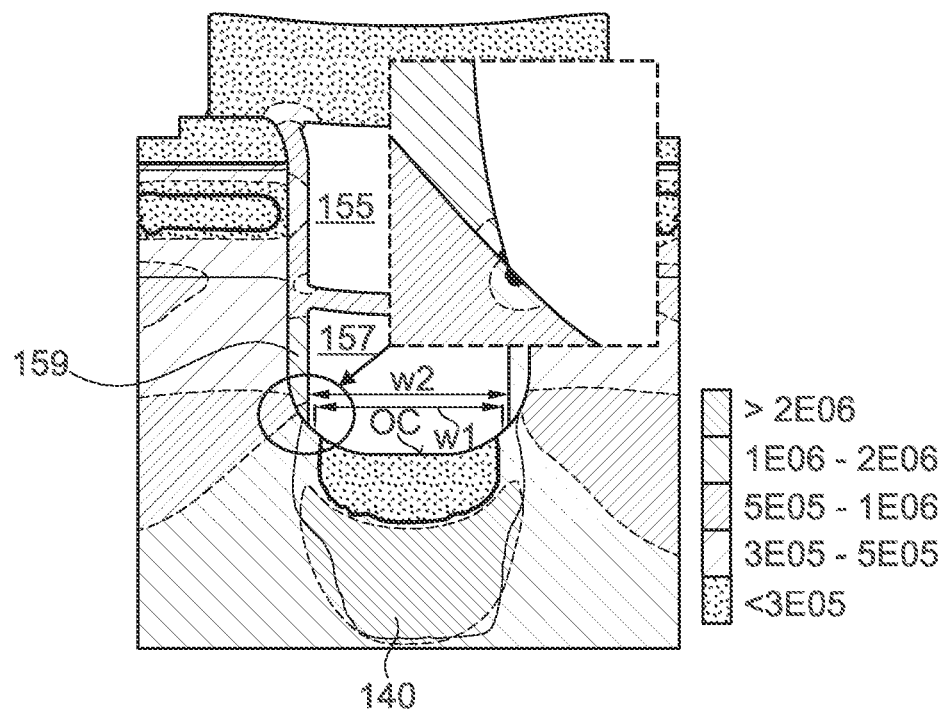

FIG. 9A shows the electric field that is effective in the field dielectric 159 of a semiconductor component 500 according to FIG. 8. FIG. 9B shows the electric field that is effective in the field dielectric 159 of a comparative component for the same reverse voltage. In the comparative component, the first width w1 is approximately equal to the second width w2, such that the ohmic contact region OC is too wide to be able to be shielded sufficiently by the shielding region 140 at high reverse voltage. Critical field strengths are reached in end sections of the field dielectric 159. By contrast, if the outer edge of the contact region OC is withdrawn far enough laterally from the outer edge of the shielding region 140, then the electric field in the field dielectric 159 remains noncritical.

Although specific embodiments have been illustrated and described here, it is obvious to the person skilled in the art that a large number of alternative and/or equivalent configurations can be used for the specific embodiments shown and described, without departing from the scope of the present invention. Therefore, this application is intended to cover any adaptations or alterations of the specific embodiments discussed here. Therefore, the intention is for this invention to be limited only by the patent claims and the equivalents thereof.

What is claimed is:

1. A semiconductor component, comprising:
a SiC semiconductor body;
a trench extending from a first surface of the SiC semiconductor body into the SiC semiconductor body, the trench having a conductive connection structure, a structure width at a bottom of the trench, and a dielectric layer covering sidewalls of the trench;
a shielding region formed in the SiC semiconductor body along the bottom, the shielding region having a central section which has a lateral first width; and
a contact formed between the conductive connection structure and the shielding region,
wherein the conductive connection structure is electrically connected to a source electrode,
wherein in at least one doping plane extending approximately parallel to the bottom, a dopant concentration in the central section deviates by not more than 10% from a maximum value of the dopant concentration in the shielding region in the doping plane,
wherein the first width is less than the structure width and is at least 30% of the structure width.

2. The semiconductor component of claim 1, wherein the doping plane connects laterally adjacent local maximum values of vertical dopant distributions in the shielding region.

3. The semiconductor component of claim 1, wherein the first width is less than a difference between the structure width and twice an average distance between the doping plane and the bottom.

4. The semiconductor component of claim 1, wherein a field dielectric in the trench has a sidewall section having a first layer thickness along a sidewall of the trench, and wherein the conductive connection structure has a second width at the bottom that is less than the difference between the structure width of the trench at the bottom and twice the first layer thickness.

5. The semiconductor component of claim 4, wherein the field dielectric has a bottom section having a second layer thickness along the bottom, wherein the second layer thickness is at most equal to the first layer thickness, and wherein the bottom section is formed in an outer section of the bottom between a part of the conductive connection structure and the shielding region.

6. The semiconductor component of claim 1, wherein a JFET partial region is formed in the SiC semiconductor body, wherein the JFET partial region and the shielding region form a unipolar junction, wherein the shielding region is formed between the trench and the JFET partial region, wherein the JFET partial region has a lateral fifth width along the unipolar junction, and wherein the fifth width is less than the first width.

7. The semiconductor component of claim 1, wherein the trench has a gate electrode and an isolation dielectric, wherein the gate electrode is formed between the first surface and the conductive connection structure, and wherein the isolation dielectric is formed between the gate electrode and the conductive connection structure.

8. A semiconductor component, comprising:
a SiC semiconductor body;
a gate electrode structure extending from a first surface of the SiC semiconductor body into the SiC semiconductor body, the gate electrode structure having a conductive connection structure;
a shielding region formed in the SiC semiconductor body at a bottom of the conductive connection structure;
a contact formed between the conductive connection structure and the shielding region;
a source region along a sidewall of the gate electrode structure, the source region extending from the first surface into the SiC semiconductor body; and
a first load electrode above the first surface and electrically connected to the source region,
wherein the conductive connection structure is electrically connected to both the first load electrode and the shielding region,
wherein the shielding region has a central section which has a lateral first width, wherein in a doping plane extending approximately parallel to the bottom, a dopant concentration in the central section deviates by not more than 10% from a maximum value of the dopant concentration in the shielding region in the doping plane.

9. The semiconductor component of claim 8, wherein the doping plane connects laterally adjacent local maximum values of vertical dopant distributions in the shielding region.

10. The semiconductor component of claim 8, wherein the gate electrode structure has a structure width at the bottom, and wherein the first width is less than the structure width and is at least 30% of the structure width.

11. The semiconductor component of claim 10, wherein the first width is less than a difference between the structure width and twice an average distance between the doping plane and the bottom.

12. The semiconductor component of claim 10, wherein the gate electrode structure has a field dielectric, wherein the field dielectric has a sidewall section having a first layer thickness along the sidewall of the gate electrode structure, and wherein the conductive connection structure has a second width at the bottom that is less than the difference between the structure width of the gate electrode structure at the bottom and twice the first layer thickness.

13. The semiconductor component of claim 12, wherein the field dielectric has a bottom section having a second layer thickness along the bottom, wherein the second layer thickness is at most equal to the first layer thickness, and wherein the bottom section is formed in an outer section of the bottom between a part of the conductive connection structure and the shielding region.

14. The semiconductor component of claim 8, wherein a JFET partial region is formed in the SiC semiconductor body, wherein the JFET partial region and the shielding region form a unipolar junction, wherein the shielding region is formed between the gate electrode structure and the JFET partial region, wherein the JFET partial region has a lateral fifth width along the unipolar junction, and wherein the fifth width is less than the first width.

15. The semiconductor component of claim 8, wherein the gate electrode structure has a gate electrode and an isolation dielectric, wherein the gate electrode is formed between the first surface and the conductive connection structure, and wherein the isolation dielectric is formed between the gate electrode and the conductive connection structure.

16. The semiconductor component of claim 15, wherein an interlayer dielectric isolates the gate electrode from the first load electrode.

17. The semiconductor component of claim 16, wherein the first load electrode is electrically connected to the source region by a contact structure that extends from the first load electrode through an opening in the interlayer dielectric as far as or into the SiC semiconductor body.

18. The semiconductor component of claim 8, wherein during an avalanche breakdown, the conductive connection structure carries away charge carriers which pass a pn junction between the shielding region and a drift zone to the first load electrode.

19. The semiconductor component of claim 8, wherein in a reverse- biased state of the semiconductor component, a unipolar charge carrier current flows via a Schottky contact and the conductive connection structure to the first load electrode.

* * * * *